United States Patent
Ross et al.

(10) Patent No.: US 10,164,464 B1
(45) Date of Patent: Dec. 25, 2018

(54) MODULAR UNINTERRUPTIBLE POWER SUPPLY

(71) Applicant: Amazon Technologies, Inc., Seattle, WA (US)

(72) Inventors: Peter George Ross, Olympia, WA (US); Nigel McGee, Ashburn, VA (US)

(73) Assignee: Amazon Technologies, Inc., Seattle, WA (US)

( * ) Notice: Subject to any disclaimer, the term of this patent is extended or adjusted under 35 U.S.C. 154(b) by 461 days.

(21) Appl. No.: 14/656,356

(22) Filed: Mar. 12, 2015

(51) Int. Cl.
*H02J 1/00* (2006.01)
*H02J 3/00* (2006.01)
*H02J 9/06* (2006.01)
*G06F 1/26* (2006.01)
*G06F 1/30* (2006.01)

(52) U.S. Cl.
CPC .............. *H02J 9/061* (2013.01); *G06F 1/263* (2013.01); *G06F 1/30* (2013.01); *H02J 9/062* (2013.01)

(58) Field of Classification Search
CPC .............. G06F 1/20–1/203; G06F 1/26; H02B 1/34–1/36; H05K 7/14–7/01
USPC .......................................................... 307/11
See application file for complete search history.

(56) References Cited

U.S. PATENT DOCUMENTS

| | | | | |
|---|---|---|---|---|
| 7,259,477 B2 * | 8/2007 | Klikic | ................... | H02J 9/062 307/14 |
| 8,384,244 B2 * | 2/2013 | Peterson | .................. | G06F 1/263 174/68.1 |
| 8,500,465 B1 * | 8/2013 | Ross | ..................... | H01R 13/502 439/79 |
| 8,994,213 B1 * | 3/2015 | Czamara | ................. | H02J 3/006 307/64 |
| 9,439,329 B1 * | 9/2016 | Towner | ................ | H05K 7/1497 |
| 9,647,491 B2 * | 5/2017 | Navarro | .................... | H02J 9/06 |
| 2004/0201279 A1 * | 10/2004 | Templeton | .............. | H02J 1/102 307/11 |

(Continued)

OTHER PUBLICATIONS

U.S. Appl. No. 14/934,056, filed Nov. 5, 2015, Amazon Technologies, Inc., Peter George Ross, et al.

(Continued)

*Primary Examiner* — Alfonso Perez Borroto
*Assistant Examiner* — Esayas Yeshaw
(74) *Attorney, Agent, or Firm* — Robert C. Kowert; Meyertons, Hood, Kivlin, Kowert & Goetzel, P.C.

(57) ABSTRACT

A modular uninterruptible power supply (UPS) provides modular uninterruptible power support to multiple rack computer systems. The modular UPS can include one or more rectifier, battery, and inverter modules installed in one or more rack frames. The modules can be installed in a common rack frame and electrically coupled via a bus bar coupled to the frame. The modules can be installed in separate rack frames and electrically coupled via a bus bar extending between the separate rack frames. The modular UPS can include multiple sets of rectifier modules and battery modules which are electrically coupled to the rack computer systems in parallel and can provide uninterruptible power support subsequent to at least one module failure. The rectifier, battery, and inverter modules installed in the rack frames can be adjusted to provide scalable power support based at least in part upon the power support requirements of the rack computer systems.

20 Claims, 16 Drawing Sheets

(56) References Cited

U.S. PATENT DOCUMENTS

| | | | |
|---|---|---|---|
| 2009/0021078 A1* | 1/2009 | Corhodzic | G06F 1/263 307/67 |
| 2010/0102633 A1* | 4/2010 | Seaton | H02J 9/06 307/64 |
| 2010/0275441 A1 | 11/2010 | Rasmussen et al. | |
| 2011/0013348 A1* | 1/2011 | Seibold | G06F 1/189 361/679.02 |
| 2011/0213735 A1* | 9/2011 | Cao | G06F 1/20 705/500 |
| 2011/0245988 A1* | 10/2011 | Ingels | G06F 1/26 700/295 |
| 2012/0074794 A1* | 3/2012 | Morales | G06F 1/26 307/147 |
| 2012/0086458 A1 | 4/2012 | Wei et al. | |
| 2012/0170175 A1* | 7/2012 | Silberbauer | H05K 7/1432 361/637 |
| 2013/0198533 A1* | 8/2013 | Bailey | G06F 1/30 713/300 |
| 2014/0183956 A1* | 7/2014 | Wang | H02J 9/062 307/64 |
| 2015/0008745 A1* | 1/2015 | Navarro | H02J 9/06 307/64 |
| 2015/0177797 A1* | 6/2015 | Butzer | G06F 1/26 713/300 |
| 2016/0284962 A1* | 9/2016 | Harding | H05K 7/20736 |

OTHER PUBLICATIONS

"Battery Circuits for Stationary Applications Designed for the Long Haul," Matthew Theriault, Designer, Hindly Power Inc., Easton, PA, downloaded from http://www.battcon.com/PapersFinal2010/TheriaultPaper2010Final_19.pdf, 2010, pp. 19-1 through 19-12.

HindlePower, "Best Battery Selector—Isolating Steering Diode Assembly for Redundant DB Power Systems," JF5048-00—Rev 1B, Jun. 18, 2015, pp. 1-4.

* cited by examiner

MODULAR UNINTERRUPTIBLE POWER SUPPLY

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage. A network of cabling, bus bars, power connectors, and power distribution units, is used to deliver the power at the lower voltage to numerous specific components in the facility.

Some data centers include back-up components and systems to provide back-up power to servers in the event of a failure of components or systems in a primary power system. In some data centers, each primary power system may have its own back-up system that is fully redundant at all levels of the power system. For example, in a data center having multiple server rooms, each server room may have its own primary power system and back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room. Providing full redundancy of the primary power systems may, however, be very costly both in terms of capital costs (in that in may require a large number of expensive switchboard, UPSs, and PDUs, for example) and in terms of costs of operation and maintenance. In addition, with respect to the primary computer systems, special procedures may be required to switch components from the primary system to a back-up system to ensure uninterrupted power supply for the servers, further increasing maintenance costs.

Some data centers have no redundancy at the PDU level. Such data centers may have a large affected zone when a UPS or PDU failure in the power system occurs. In addition, some data centers have "single threaded" distribution via the electrical supply to the floor, and in which maintenance can only be performed when the components are shut-off.

Some back-up power systems receive power from one or more utility power sources. Where such power sources are interrupted, back-up power support can be interrupted. As a result, where the utility power feeds to both the primary and back-up power system are interrupted, power support for the loads may be lost. While some power systems may provide power via one or more back-up generators, UPSs, etc., the power requirements of the load may exceed the power support capabilities of such generators, UPSs, etc. In addition, where utility power is interrupted for an extended period of time, the duration of the interruption may exceed the power generation capacities of such generators, UPSs, etc.

Figure 1:
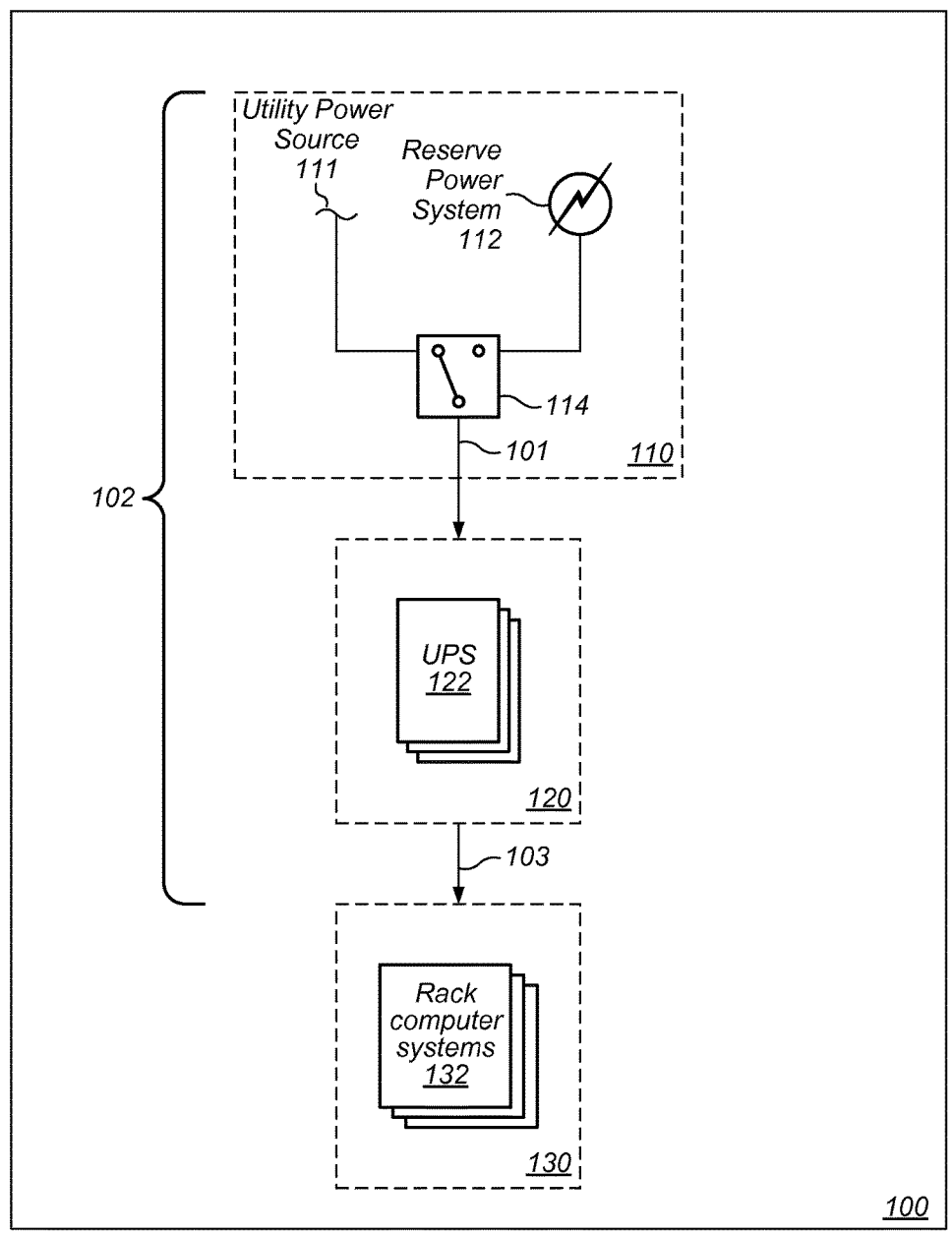
FIG. 1 is a block diagram illustrating a power distribution system providing redundant uninterruptible power support to a set of rack computer systems via a set of modular uninterruptible power supplies, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular uninterruptible power supply (UPS) are disclosed. According to one embodiment, a data center includes a computer room, which includes sets of rack computer systems which perform computing operations, and a power distribution system which provides electrical power support to the rack computer systems. The power distribution system includes a power feed and modular uninterruptible power supplies (UPSs) installed in the computer room. The power feed selectively supplies electrical power from a selected one of a utility power source or a generator power source. The modular UPSs each receive electrical power from the power feed and provide uninterruptible power support to a separate corresponding set of rack computer systems in the computer room. Each modular UPS includes a rack computer system frame which structurally supports at least one module, a rectifier module which is mounted in the rack computer system frame and electrically coupled to the power feed, and a battery module which is mounted in the rack computer system frame, electrically coupled to the at least one rectifier module, and electrically coupled to the corresponding set of rack computer systems.

According to one embodiment, an apparatus includes a modular uninterruptible power supply (UPS) which is mounted in a rack computer system frame and provides uninterruptible power support to at least a plurality of rack computer systems. The modular UPS includes a rectifier module electrically coupled to a power source and a battery module electrically coupled to the rectifier module and configured to supply electrical power to the plurality of rack computer systems.

According to one embodiment, a method includes configuring a modular uninterruptible power supply (UPS) to provide uninterruptible power support to a plurality of rack computer systems. The configuring includes installing a rectifier module in at least one rack computer system frame, such that the rectifier module is configured to receive electrical power from at least one power source, and installing a battery module in at least one rack computer system frame, such that the battery module is electrically coupled with the rectifier module and is configured to supply electrical power to the plurality of rack computer systems.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, providing power "support", power feed support, etc. refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a reserve power system can provide reserve power support to an electrical load by providing a reserve power feed that can be selectively routed to the load by a transfer switch that is downstream of the reserve power system and upstream of the load, where the transfer switch may selectively route the reserve power feed or a primary power feed to the load based at least in part upon one or more conditions associated with the primary power feed.

As used herein, "primary power" means any power that can be supplied to an electrical load, for example, during normal operating conditions.

As used herein, "reserve power", "secondary power", etc. means power that can be supplied to an electrical load upon the failure of, or as a substitute for, primary power to the load.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "module" is a component or a combination of components. A module may include functional elements and systems, such as computer systems, circuit boards, racks, blowers, ducts, and power distribution units, as well as structural elements, such a base, frame, housing, or container.

As used herein, one component in a power infrastructure is "downstream" from another component in the system if the one component receives power from the other component or is at a lower level in the system than the other component. For example, a floor power distribution unit (PDU) may be downstream from a UPS, or a data center may be downstream from a power plant.

As used herein, a "power feed" includes power from any source, including but not limited to power received from a utility power source that can be supplied to an electrical load. In some embodiments, a "power feed" may be received from the output of a transformer. For example, a low-voltage power feed received from a transformer may include low-voltage power received over a low-voltage power transmission line coupled to the transformer.

As used herein, "power transmission line" a line that transmits power from one component to another component. Examples of power transmission lines include conductors that carry power from a UPS to a floor PDU, conductors that carry power from a floor PDU to a rack PDU, and conductors that carry power from a rack PDU to a server power supply unit, and power lines. Power transmission lines may have any form, such as a cable, bus bar, or other conductive member or device.

As used herein, "switching device" or "switch" includes an electrical switch that can break an electrical current. A switching device can interrupt a power flow, divert one of the source or output of a power feed, etc. For example, a switching device may selectively route a power feed from one of two or more sources to a single output.

As used herein, "switchgear" includes electrical switching devices, fuses, circuit breakers, or combinations thereof used to isolate components in an electrical system. Switchgear can isolate downstream components from upstream power feeds. In some embodiments, switchgear isolates components to protect the equipment from electrical faults elsewhere in an electrical system. For example, switchgear in a computing facility may isolate various electrical and computing systems in the facility from upstream power feeds. In some embodiments, switchgear includes switching devices, fuses, circuit breakers, or combinations thereof used to switch between separate power sources and can include one or more transfer switches.

As used herein, one component in a system is "upstream" from another component in the system if the one component supplies power to the other component or is at a higher level in the system than the other component. For example, an electrical substation supplying power to a data center may be upstream from the data center, or a transformer may be upstream from a UPS.

In various embodiments, an uninterruptible power system includes one or more modular uninterruptible power supplies (UPSs) which are configured to provide uninterruptible power support to electrically coupled downstream electrical loads. Each UPS can include a set of modules, referred to herein as UPS modules, which are electrically coupled together and collectively configure the modular UPS to provide uninterruptible power support to the electrically coupled downstream electrical loads. A modular UPS which is configured to provide a certain amount of uninterruptible power can be referred to as being configured to provide a certain amount of uninterruptible power support and can further be referred to as having a certain amount of uninterruptible power support capacity.

UPS modules can include one or more rectifier modules, battery modules, inverter modules, some combination thereof, etc. Each UPS module is configured to provide one or more sets of UPS module functionality which supports at least a portion of the uninterruptible power support capacity of the modular UPS. For example, a rectifier module is configured to provide a particular set of UPS module functionality which comprises rectification of received alternating-current ("AC") electrical power into direct-current ("DC") electrical power. In another example, a battery module is configured to provide a particular set of UPS module functionality which comprises storage and discharge of DC electrical power. In another example, an inverter module is configured to provide a particular set of UPS module functionality which comprises conversion of receive DC electrical power into AC electrical power.

Two or more UPS modules electrically coupled together can collectively provide at least a certain amount of uninterruptible power support capacity of the modular UPS based at least in part upon the UPS module functionality provided by the UPS modules, thereby collectively comprising a modular UPS. For example, an electrically coupled rectifier module and battery module can collectively provide DC uninterruptible power support to downstream electrical loads, where the rectifier module converts received AC power to DC power and the battery module both stores DC power supplied by the rectifier module and discharges the stored DC power in response to the loss of power from the rectifier module. As referred to herein, downstream electrical loads can include downstream rack computer systems which are configured to perform computing operations.

In some embodiments, a modular UPS includes a set of various UPS modules which are electrically coupled to each other via one or more instances of power transmission lines. One or more instances of power transmission lines, in some embodiments, include one or more instances of power cabling. In some embodiments, one or more instances of power transmission lines which electrically couple two or more UPS modules to each other includes one or more power bus bars. A power bus bar, in some embodiments, includes a power busway which can extend through an open enclosure of a room separately from rack computer systems and power distribution components which are electrically coupled to the power busway.

In some embodiments, the modular UPS includes one or more rack computer system frames, also referred to herein interchangeably as "rack frames", in which multiple UPS modules are installed to at least partially comprise on or more modular UPSs. As used herein, a rack frame can include a structural frame which is configured to structurally support one or more modules and conforms to one or more standardized rack computer system form factors. For example, a rack computer system frame can include a structural frame which is configured to conform to a standardized 19-inch rack form factor, a standardized 23-inch rack form factor, etc.

In some embodiments, one or more of the UPS modules included in a modular UPS are configured to be installed in one or more rack frames, such that the one or more UPS modules conforms to one or more rack unit dimensions. For example, a UPS module included in a modular UPS can be configured to conform to a 1-rack unit ("1 U") form factor, 2-rack unit form factor ("2 U"), etc. Where a rack computer system frame is configured to accommodate up to 42 rack units ("42 U") of modules, and where UPS modules conform to a 1 U height and extend along the full width and depth of the rack frame interior, up to 42 UPS modules could be installed in the frame.

In some embodiments, UPS modules comprising a modular UPS can be installed interchangeably in various positions within one or more rack frames. As a result, a modular UPS which includes UPS modules installed in one or more rack frames can be installed in a computer room in which rack computer systems are installed, such that the space "footprint" of the modular UPS on the floor of the computer room conforms to one or more footprints configured to accommodate rack computer systems in one or more arrangements in the room. For example, in a computer room which includes a set of rack positions, which are configured to accommodate rack computer systems and are arranged in a 2×30 configuration, forty-eight rack computer systems can be installed in forty-eight contiguous rack positions in the set of rack positions in a 2×28 configuration, while a modular UPS providing uninterruptible power support to the forty-eight rack computer systems can include UPS modules installed in two rack frames which are installed in the remaining two available rack positions in a 2×1 configuration. In some embodiments, a rack frame in which UPS modules are installed is at least partially empty, such that additional UPS modules can be installed in the frame over time, thereby enabling the uninterruptible power support capacity of the modular UPS to be adjusted over time to accommodate adjustments in the power support requirements of the coupled downstream rack computer systems. In some embodiments, the adjustment can be implemented while the modular UPS is presently coupled to one or more upstream power feeds and is presently supplying electrical power to one or more downstream rack computer systems.

In some embodiments, a UPS module includes an array of sub-modules which collectively provide the UPS module functionality provided by the UPS module. One or more of the quantity and arrangement of sub-modules in the UPS module can be adjusted to adjust the UPS module functionality provided by the UPS module. The UPS module can include a chassis which is configured to be mounted in a rack computer system frame and to structurally support the sub-modules and a backplane which includes sub-module connectors configured to electrically couple with sub-modules mounted in the chassis and at least one power connector which is electrically coupled to the sub-module connectors and is configured to be coupled with one or more instances of power transmission lines to electrically couple sub-modules to the instances of power transmission lines.

In some embodiments, a power transmission line electrically coupling UPS modules in a modular UPS includes a bus bar which is coupled to a rack computer system frame in which two or more UPS modules are installed, such that the UPS modules are electrically coupled to each other via separately coupling with the bus bar. The bus bar can include power connectors which are configured to couple with power connectors of the separate UPS modules. In some embodiments, the bus bar and the UPS modules include power connectors which are blind mate connectors, and the bus bar can be coupled to the rack frame in a configuration which aligns the power connectors of the bus bar with the positions of power connectors of UPS modules in one or more positions in the rack frame when the UPS modules are mounted in the one or more various rack positions, such that mounting a UPS module in one or more positions in the rack frame can include aligning and coupling the blind mate power connector of the UPS module with a corresponding blind mate power connector of the bus bar, thereby electrically coupling the UPS module to the bus bar. In some embodiments, the UPS module is configured to couple with the bus bar power connector based on slidably mounting the UPS module in a position in the rack frame where a blind mate power connector of the UPS module is slidably coupled with the corresponding blind mate power connector of the bus bar. As used herein, installing a UPS module in a rack frame includes mounting the UPS module in one or more positions in the rack frame, such that the UPS module is at least partially structurally supported by the rack frame, and electrically coupling the UPS module to at least one instance of power transmission lines, which can include a bus bar.

In some embodiments, a modular UPS is configured to provide adjustable uninterruptible power support to multiple downstream rack computer systems, such that the magnitude of uninterruptible power support which the modular UPS is configured to provide can be adjusted, in one or more of power support redundancy and power support capacity, to at least meet the uninterruptible power support requirements of multiple coupled downstream loads which can change over time. In some embodiments, such adjustment comprises adjusting the configuration of UPS modules in a modular UPS based at least in part upon changes in the total uninterruptible power support requirements of the downstream rack computer systems, including increases in said requirements associated with coupling one or more additional rack computer systems to the modular UPS.

In some embodiments, adjusting the configuration of UPS modules in a modular UPS comprises adjusting the quantity of various UPS modules installed in one or more rack frames of the modular UPS. For example, where a modular UPS comprises a rectifier module which can rectify up to 20 KWa of electrical power and a battery module, electrically coupled to the rectifier module, which can store and discharge up to 10 KWa of electrical power in the absence of upstream power received at the rectifier module, the modular UPS can be considered to be configured to provide 10 KWa of uninterruptible power support, have an uninterruptible power support capacity of 10 KWa, etc. Where the power support requirements of a downstream electrical load electrically coupled to the battery module is at least 15 KWa, an additional 10 KWa battery module can be electrically coupled to the presently-included rectifier module and battery module of the modular UPS, thereby adding the additional battery module into the modular UPS and adjusting the uninterruptible power support capacity of the modular UPS from 10 KWa to 20 KWa and thereby at least meeting the 15 KWa power support requirement of the downstream load. As used herein, the power support requirement of an electrical load includes an amount of electrical power required to be received by the electrical load to support at least partial operational performance of the electrical load.

As referred to herein, a rectifier module can refer to a module which is configured to convert received electrical power from alternating-current power to direct-current power. As referred to herein, an inverter module can refer to a module which is configured to convert received electrical power from direct-current power to alternating-current power. In some embodiments, a rectifier module included in a modular UPS is configured to be electrically coupled to one or more upstream power feeds which supply electrical power from one or more power sources. Such one or more power sources can be configured to supply one or more of operating power, reserve power, etc. One or more upstream switching devices, including one or more instances of switchgears, can be configured to selectively route one or more of operating power, reserve power, etc. to the modular UPS via the power feed. The rectifier module can rectify direct-current ("DC") power received from one or more direct-current power feeds.

In some embodiments, a battery module is configured to receive, store, and discharge electrical power. The battery module can be configured to discharge electrical power to one or more downstream rack computer systems electrically coupled to the battery module in the event of an at least partial loss of received electrical power from one or more upstream power feeds to which the battery module is electrically coupled.

In some embodiments, a modular UPS includes a particular UPS configuration of two or more UPS modules which provides a particular amount of uninterruptible power support and a particular level of redundancy of said power support. Such a UPS configuration can be based at least in part upon the power support requirements of the coupled downstream rack computer systems. For example, where the downstream rack computer systems are configured to receive DC electrical power, a modular UPS can include one or more rectifier modules, battery modules, etc., such that inverter modules are absent from the modular UPS and the modular UPS is configured to supply DC power from one or more of the rectifier module and the battery module. As a result, the configuration of UPS modules comprising the modular UPS can be referred to as being in a "DC" power UPS configuration. In another example, where the downstream rack computer systems are configured to receive alternating-current ("AC") power, a modular UPS electrically coupled to the downstream loads can include one or more rectifier modules, battery modules, inverter modules, etc., such that the modular UPS is configured to supply AC power from the inverter module, where the inverter module supplies AC power which is converted from DC power received from one or more rectifier modules, battery modules, some combination thereof, etc. included in the modular UPS. As a result, the configuration of UPS modules comprising the modular UPS can be referred to as being in an "AC" power UPS configuration.

FIG. 1 is a block diagram illustrating a data center which includes computer rooms and a power distribution system providing redundant uninterruptible power support to a set of rack computer systems in the computer rooms via a set of modular uninterruptible power supplies, according to some embodiments.

Data center 100 includes a set of computer rooms 130 which each include a set of rack computer systems 132 which are configured to perform computing operations. The data center 100 further includes one or more power distribution systems 102 which are configured to provide electrical power support to the rack computer systems to support computing operations performed by the rack computer systems 132.

The power distribution system 102 includes a power source 110 system which is configured to provide source power from one or more power sources. As shown, the power sources can include a utility power source 111 which can provide utility power, a reserve power system 112 which can provide reserve power from one or more reserve power sources, etc. In some embodiments, only one power source is present in system 110. Where multiple power sources are present in system 110, the system 110 can include one or more switching devices 114 which are configured to selectively feed power from a selected one of the power sources. As shown, for example, a switching device 114, which can include an automatic transfer switch, a switchgear apparatus, some combination thereof, etc., is configured to selectively feed power from a particular selected one of the utility power source 111 or the reserve power system 112 to a power feed 101 which can include one or more instances of power transmission lines.

The power distribution system 102 includes an uninterruptible power supply (UPS) system 120 which is configured to provide uninterruptible power support to the rack computer systems 132 via a power feed 103 which can include one or more instances of power transmission lines. The UPS system 120 includes a set of one or more modular UPSs 122 which collectively provide uninterruptible power support to the rack computer systems 132. In some embodiments, the UPSs 122 are coupled in parallel with feed 101 and are further coupled in parallel with feed 103, so that each UPS 122 receives electrical power from the feed 101 and discharges electrical power to the feed 103. In some embodiments, separate UPSs 122 are coupled to one or more of separate feeds 101 which receive power from separate power sources, separate feeds 103 which supply power to separate sets of rack computer systems 132, some combination thereof, etc.

In some embodiments, the entire set of modular UPSs 122 are electrically coupled in parallel to the entirety of the rack computer systems 132 in one or more computer rooms 130. As a result, where the UPSs 122 collectively have excess uninterruptible power support capacity with respect to the power support requirements of the rack computer systems 132 to which the UPSs 122 are electrically coupled, a threshold level of uninterruptible power support of the rack computer systems 132, below which computing operations by the entirety of the supported rack computer systems 132 cannot be maintained, can be provided by the UPSs 122 even in the event that one or more of the individual UPSs 122 fails to provide uninterruptible power support. The effect of the failure of threshold uninterruptible power support provided by one set of modular UPSs 122 affects all of the rack computer systems 132 and can result in a loss of power support of the rack computer systems 132.

In some embodiments, separate limited selections of the UPSs 122 in the system 120 are coupled in parallel to separate limited selections of the rack computer systems, so that the separate UPSs 122 provide redundant uninterruptible power support to separate rack computer systems. As a result, at the cost of reduced redundancy of uninterruptible power support for each rack computer system 132 in a computer room, the effect of the failure of threshold uninterruptible power support provided by one set of modular UPSs 122 is restricted to a limited selection of rack computer systems 132, and the remainder of rack computer systems receiving uninterruptible power support from other sets of modular UPSs 122 are unaffected by the failure.

In some embodiments, the power support requirements of separate rack computer systems 132 which are electrically coupled to separate UPSs 122 are different. As a result, different sets of UPSs 122, which are coupled to different sets of rack computer systems 132, are configured to provide different threshold amounts of uninterruptible power support. In some embodiments, each modular UPS 122 includes a particular UPS configuration of separate UPS modules which are coupled together to establish one or more modular UPSs which collectively provides at least the threshold level of uninterruptible power support required to meet the power support requirements of the rack computer systems to which the modular UPS are respectively electrically coupled. As a result, the allocation of power distribution component resources, including UPS modules, rack frames, etc. to provide uninterruptible power support to rack computer systems in one or more data centers can be optimized, based at least in part upon adjustable coupling and configuring of UPS modules, to provide scalable uninterruptible power support to rack computer systems.

In some embodiments, a set of UPS modules which can comprise one or more modular UPSs can be configured, via selective electrical coupling of one or more sets of UPS modules, to provide one or more power support redundancies to the supported rack computer systems. For example, a set of UPS modules can be electrically coupled together in a UPS configuration which results in two modular UPSs which each have a certain uninterruptible power support capacity and provide 2N redundancy of the certain amount of uninterruptible power support, a UPS configuration which results in a single UPS module which provides double the uninterruptible power support and 1N redundancy, some combination thereof, etc. As a result, the modular UPSs 122 in a data center can be configured to provide scalable support capacity and adjustable redundancy. In some embodiments, UPS modules can be removed, added, swapped, etc. from one or more modular UPSs while the modular UPSs are presently providing power support to one or more rack computer systems. As a result, one or more of the power support capacity, redundancy, etc. provided by one or more modular UPSs can be continually adjusted based at least in part upon dynamic variations in one or more of power support requirements, redundancy requirements, etc. of the supported rack computer systems. For example, where additional rack computer systems are electrically coupled downstream of a modular UPS following initial installation of the UPS via an initial set of electrically coupled UPS modules, additional UPS modules can be installed in one or more rack frames comprising the modular UPS and electrically coupled to the initial set of UPS modules to augment the uninterruptible power support capacity of the modular UPS to accommodate the increased power support requirements imposed on the modular UPS by the additional rack computer systems.

Figure 2A:
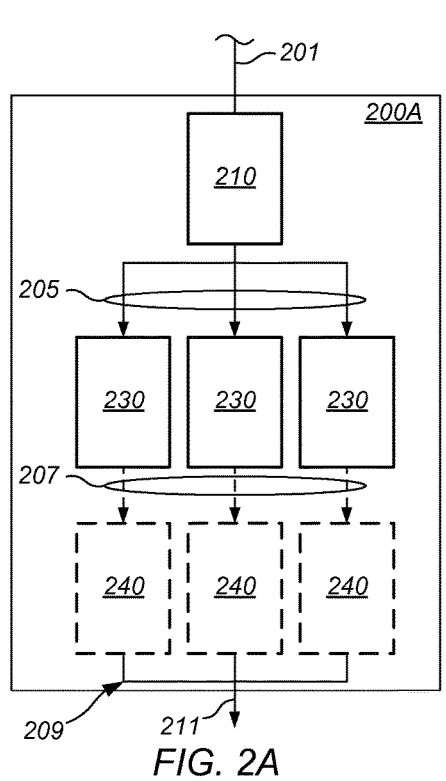
FIG. 2A-C illustrate UPS configurations of modular uninterruptible power supplies, according to some embodiments.
Figure 2B:
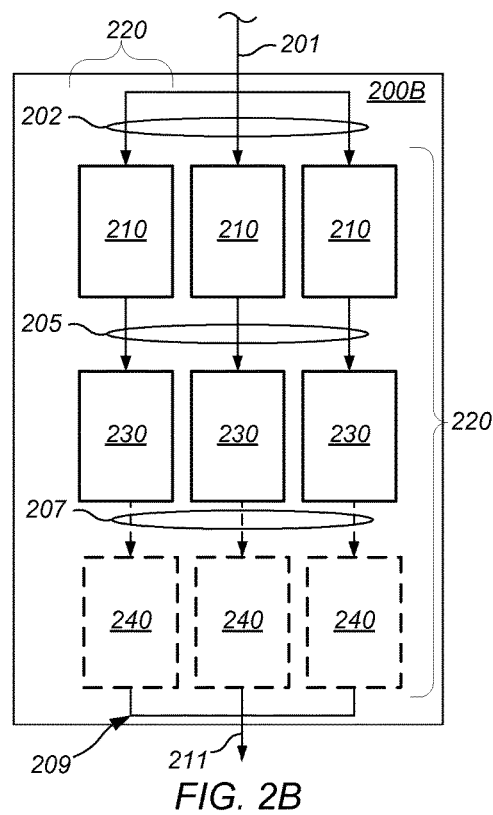
Figure 2C:
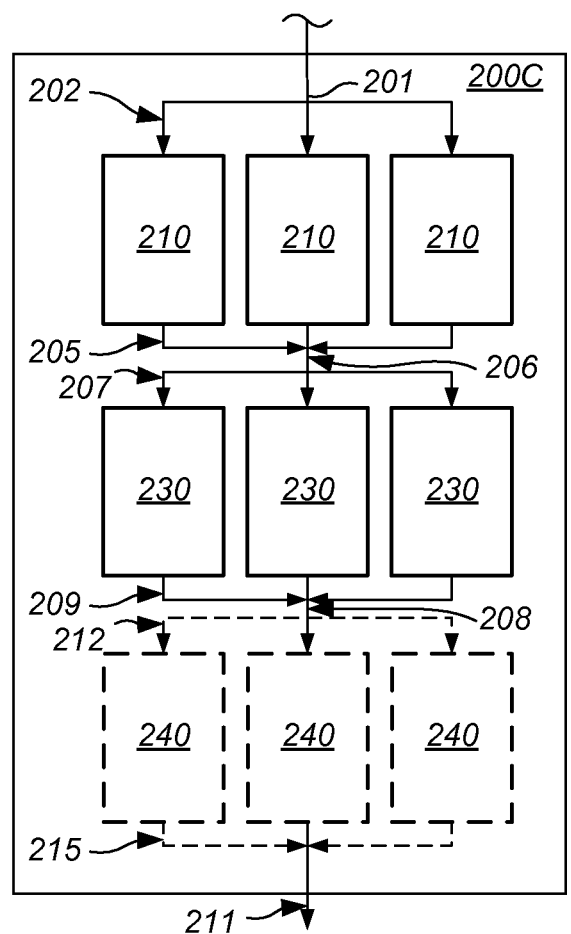

FIG. 2A-C illustrate UPS configurations of modular uninterruptible power supplies, according to some embodiments. The modular UPSs illustrated in FIG. 2A-C can include any of the embodiments included herein.

In some embodiments, a modular UPS includes one or more sets of UPS modules which are electrically coupled together and collectively provide the uninterruptible power support capacity of the modular UPS. The one or more sets of UPS modules can be electrically coupled together in various arrangements, referred to herein as UPS configurations, which result in various power support redundancies of the uninterruptible power support capacity of the modular UPS. For example, some UPS configurations result in a "single-string" UPS configuration where at least one set of UPS module functionality included in the modular UPS, including rectification, electrical storage and discharge, inversion, some combination thereof, etc. is provided by a single UPS module, which can result in economies of scale and can result in the single UPS module presenting a single point of failure in the modular UPS. In another example, some UPS configurations result in a "multi-string" configuration where multiple copies of a given UPS module are electrically coupled in parallel to collectively provide at least one set of UPS module functionality included in the modular UPS, which can provide redundancy and at least partially configures the modular UPS to continue to provide at least a certain amount of uninterruptible power support subsequent to at least one of the parallel UPS modules failing.

FIG. 2A illustrates a modular UPS 200A which includes UPS modules which are electrically coupled together in a single-string UPS configuration, where at least one UPS module provides an entirety of at least one portion of the uninterruptible power support capacity of the UPS. UPS modules included in UPS 200A includes at least a rectifier module 210 and battery modules 230. In some embodiments, the UPS 200A can further include one or more inverter modules 240, based at least in part upon whether the UPS configuration of the UPS 200 includes a configuration which provides AC uninterruptible power support or DC uninterruptible power support.

As shown in FIG. 2A, UPS 200A includes UPS modules electrically coupled in a single-string UPS configuration which includes a single rectifier module 210 which receives the entirety of electrical power received at the UPS 200A via feed 201 and supplies the entirety of the rectified electrical power to the various battery modules 230 via DC power transmission lines 205. The battery modules 230 are electrically coupled to one or more distribution feeds 209 via one or more instances of power transmission lines 207, 209. The power transmission lines 205, 207, 209 can include one or more instances of power transmission lines, including power cables, bus bars, busways, etc. In some embodiments, two or more of the power transmission lines 205, 207, 209 comprise a common bus bar, such that two or more UPS modules coupled to the common bus bar are electrically coupled in parallel.

As shown, the single rectifier module 210 provides the entirety of the rectification UPS module functionality, which can also be referred to as the "rectification capacity", of the UPS 200A. Such a single rectifier module 210, in some embodiments, provides a more efficient use of physical space associated with the amount of rectification provided by the module 210, relative to multiple rectification modules collectively providing the same rectification capacity in parallel. The rectifier module 210 also provides at least one single point of failure in the UPS 200A, as a failure of the rectifier 210 can result in a loss of electrical power received at the battery modules 230. While the battery modules 230 can respond by supplying electrical power discharged from the battery modules to the feed 211, the loss of the rectifier module 210 can result in the battery modules being precluded from recharging and ultimately being exhausted of stored electrical power, even if the feed 201 continues to carry electrical power.

In some embodiments, a modular UPS includes multiple single points of failure. For example, UPS 200A can include a single battery module 230 coupled to the rectifier module 210, such that the battery module 230 comprises a single point of failure in the UPS.

In some embodiments, the UPS 200A includes one or more inverter modules 240 which are electrically coupled to the battery modules 230 via lines 207 and to feed 211 via lines 209, so that the inverter modules 240 are configured to convert electrical power received from the battery modules 230 to AC power and supply the AC power to one or more downstream rack computer systems via feed 211. Such inverter modules 240 can be included in a UPS 200A which is configured to supply AC uninterruptible power, such that the UPS 200A has an AC power UPS configuration. In some embodiments, the UPS 200A does not include inverter modules 240, so that the battery modules 230 are electrically coupled to the feed 211 via one or more of lines 207, 209 and are configured to supply DC power to one or more downstream rack computer systems via feed 211. Such a DC UPS configuration can be included in a UPS 200A which is configured to supply DC uninterruptible power.

FIG. 2B illustrates a modular UPS 200B which includes UPS modules which are electrically coupled together in a redundant UPS configuration, where multiple parallel sets of UPS modules provide at least some redundancy in the uninterruptible power support capacity of the UPS 200B and where each individual set of UPS modules includes a single point of failure. Each set 220 of UPS modules included in UPS 200B includes at least a rectifier module 210 and battery module 230.

In some embodiments, each set 220 can further include one or more inverter modules 240, based at least in part upon whether the UPS configuration of the UPS 200B includes a configuration which provides AC uninterruptible power support or DC uninterruptible power support.

As shown, each set 220 of UPS modules is coupled in parallel with feeds 201, 211, so that a failure of a UPS module in any single set 220 does not affect the uninterruptible power support capacity of other sets 220 and results in the UPS 200B being configured to maintain at least some uninterruptible power support capacity subsequent to a failure of at least one UPS module included therein. For example, as shown in the illustrated embodiment, where a single battery module 230 in one of the sets 220 fails, the respective set 220 can fail to provide uninterruptible power support, resulting in a loss of uninterruptible power support capacity associated with that respective set 200, but the other two sets 220 can remain unaffected, thereby precluding the failure of the single battery module 230 from resulting in the total loss of uninterruptible power support capacity of the UPS 200B.

In the illustrated embodiment, where the loss of uninterruptible power support capacity associated with a single set 220 results in a loss of ⅓ of the uninterruptible power support capacity of the UPS 200B; where the UPS 200B is coupled to a set of downstream rack computer systems, via feed 211, for which the threshold uninterruptible power support requirements are no more than ⅔ of the total uninterruptible power support capacity of UPS 200B, the UPS 200B can continue to meet the threshold uninterruptible power support requirements of the loads even if the uninterruptible power support capacity associated with a single set 220 of UPS modules is lost. As a result, UPS 200B has at least some uninterruptible power support capacity redundancy. In some embodiments, the quantity of sets 220 can be adjusted, including adding new additional sets of UPS modules, removing a set, swapping an entire set of UPS modules, some combination thereof, etc.

FIG. 2C illustrates a modular UPS 200C which includes UPS modules which are electrically coupled together in a redundant UPS configuration, where multiple sets of UPS modules provide redundant support capacity in the UPS 200C. Each set 220 of UPS modules included in UPS 200C includes multiple rectifier modules 210 and multiple battery modules 230, where the modules 210, 230 are electrically coupled in parallel with each other, so that the multiple modules 210 collectively provide redundant rectification of the power received from the feed 210 and is provided to the collective battery modules 230 via lines 205, 207, and transmission line 206. In some embodiments, UPS 200C can further include multiple inverter modules 240 coupled in parallel via lines 209, 212, 215, and transmission line 208, based at least in part upon whether the UPS configuration of the UPS 200C includes a configuration which provides AC uninterruptible power support or DC uninterruptible power support. As shown, the UPS configuration of the UPS 200C restricts a failure of any single UPS module from causing the total loss of the uninterruptible power support capacity of the UPS 200C and results in the UPS 200C being configured to maintain at least some uninterruptible power support capacity subsequent to a failure of at least one UPS module included therein.

For example, as shown in the illustrated embodiment, where a single battery module 230 fails, the remaining battery modules 230 can remain on-line and continue to supply electrical power to the feed 211, resulting in a reduction of uninterruptible power support capacity associated with that battery module which failed but precluding the failure of the single battery module 230 from resulting in the total loss of uninterruptible power support capacity of the UPS 200C. Furthermore, as none of the other UPS modules are coupled entirely in series with the failed battery module, only electrical storage and discharge capacity is affected and rectification and inversion capacity of the UPS 200C is unaffected.

In some embodiments, lines 206 and 208 are a common transmission line, including one or more bus bars. As a result, at least the rectifier modules 210 and battery modules 230 can be electrically coupled in parallel with each other. Where the UPS configuration of the UPS 200C is a DC UPS configuration, such that the inverter modules 240 are absent from UPS 200C, the lines 206, 208, and feed 211 can be a common bus bar which is configured to carry DC power. Where the inverter modules 240 are present, the rectifier modules 210, battery modules 230, and inverter modules 240 can be electrically coupled in parallel to a common DC bus bar, and the inverter modules 211 can be further coupled to a separate AC power transmission line 211 which can include a separate bus bar configured to carry AC power.

Figure 3:
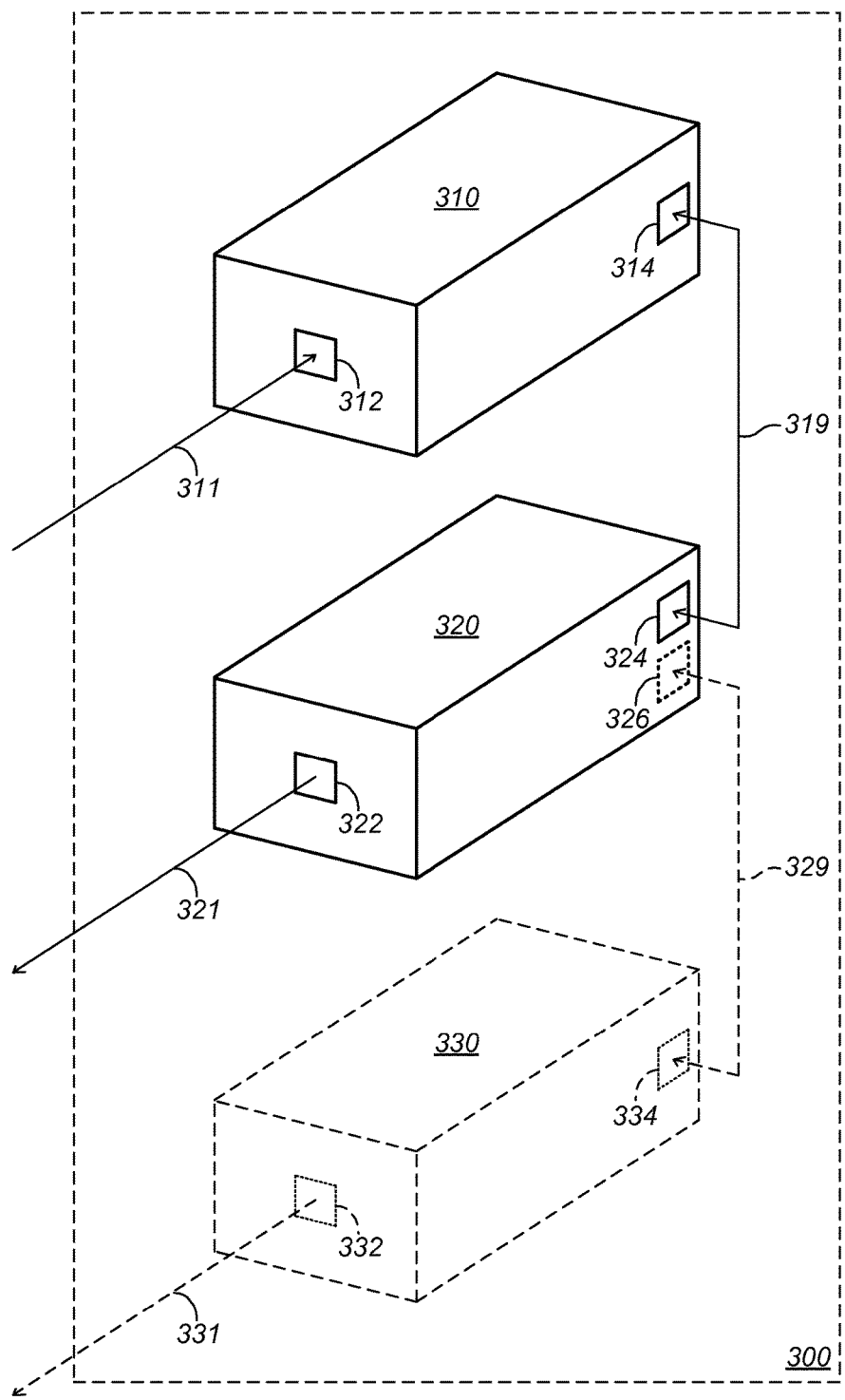
FIG. 3 illustrates a modular uninterruptible power supply (UPS) which includes a set of electrically-coupled UPS modules which collectively provide uninterruptible power support, according to some embodiments.

FIG. 3 illustrates a modular uninterruptible power supply (UPS) which includes a set of electrically-coupled UPS modules which collectively provide uninterruptible power support, according to some embodiments. The modular UPS 300 shown in FIG. 3 can be included in any of the embodiments included herein.

In some embodiments, a modular UPS includes multiple UPS modules which are electrically coupled in series via one or more instances of power transmission lines. The modular UPS 300 includes a rectifier module 310, a battery module 320 and can include an inverter module 330 based at least in part upon whether the UPS 300 is configured to provide DC uninterruptible power support or AC uninterruptible power support. The rectifier module includes an AC feed connector 312 which is configured to couple with an instance of power transmission lines 311 which carries an AC power feed and receive AC power, from one or more power sources, via the connector 312. The rectifier module 310 includes a DC connector 314 which is configured to supply DC power converted by the rectifier module 310.

The battery module 320 is configured to store received DC electrical power and supply DC electrical power from one or more of received DC power or stored electrical power. As shown, the battery module includes a DC connector 324 which is electrically coupled to the DC connector 314 of the rectifier module 310 via an instance of power transmission lines 319. The instance 319 can, in some embodiments, include a bus bar configured to carry DC power. The battery module 320, in some embodiments, includes a DC output connector 322 which is configured to be coupled to an instance 321 of power transmission lines which carries a distribution feed and which is electrically coupled to one or more downstream rack computer systems, thereby configuring the battery module 320 to provide power support to the downstream rack computer systems. In the illustrated embodiment, power supplied to the instance 321 passes through the battery module 320 and comprises one or more of DC power received at the battery module 320 from the rectifier module 310 via instance 319, stored electrical power discharged by the battery module 320, etc.

In some embodiments, UPS 300 includes an inverter module 330 which is configured to convert received DC power to AC power. The inverter module 330 can be included in a UPS configuration of UPS modules which is configured to provide AC uninterruptible power support to downstream rack computer systems. As shown, the inverter module includes a DC connector 334 which is electrically coupled to a DC connector 326 of the battery module 320 via an instance of power transmission lines 329. The instance 329 can, in some embodiments, include a bus bar configured to carry DC power. In some embodiments, instances 319, 329 are a common bus bar, connector 326 is absent, and each module 310, 320, 330 is coupled to the bus bar in parallel via respective DC connectors. The inverter module 330 includes an AC output connector 332 which is configured to be coupled to at least one instance 331 of power transmission lines which carries a distribution feed and which is electrically coupled to one or more downstream rack computer systems, thereby configuring the inverter module 330 to provide AC power support to the downstream rack computer systems. In the illustrated embodiment, power received at the inverter module 330 includes power supplied by at least one of the battery module 320, the rectifier module 310, some combination thereof, etc.

In some embodiments, additional rectifier modules 310, battery modules 320, inverter modules 330, etc. can be added, removed, swapped, and electrically coupled in various arrangements, so that the UPS 300 is configured to provide one or more various amounts of uninterruptible power support, redundancies, etc. The quantity of UPS modules 310, 320, 330 included in the UPS 300 can be dynamically adjusted to adjust the uninterruptible power support capacity of the UPS 300 while the UPS is presently providing power support to downstream rack computer systems, where the dynamic adjustment enables dynamic allocation of UPS modules to minimize excess power support capacity of the UPS 300 and further enables rapid adaptability of the UPS to accommodate changes in the requirements of downstream rack computer systems, including changes in one or more of redundancy requirements, power support requirements, etc. which can result from additions, removals, etc., of the coupled downstream rack computer systems.

Figure 4:
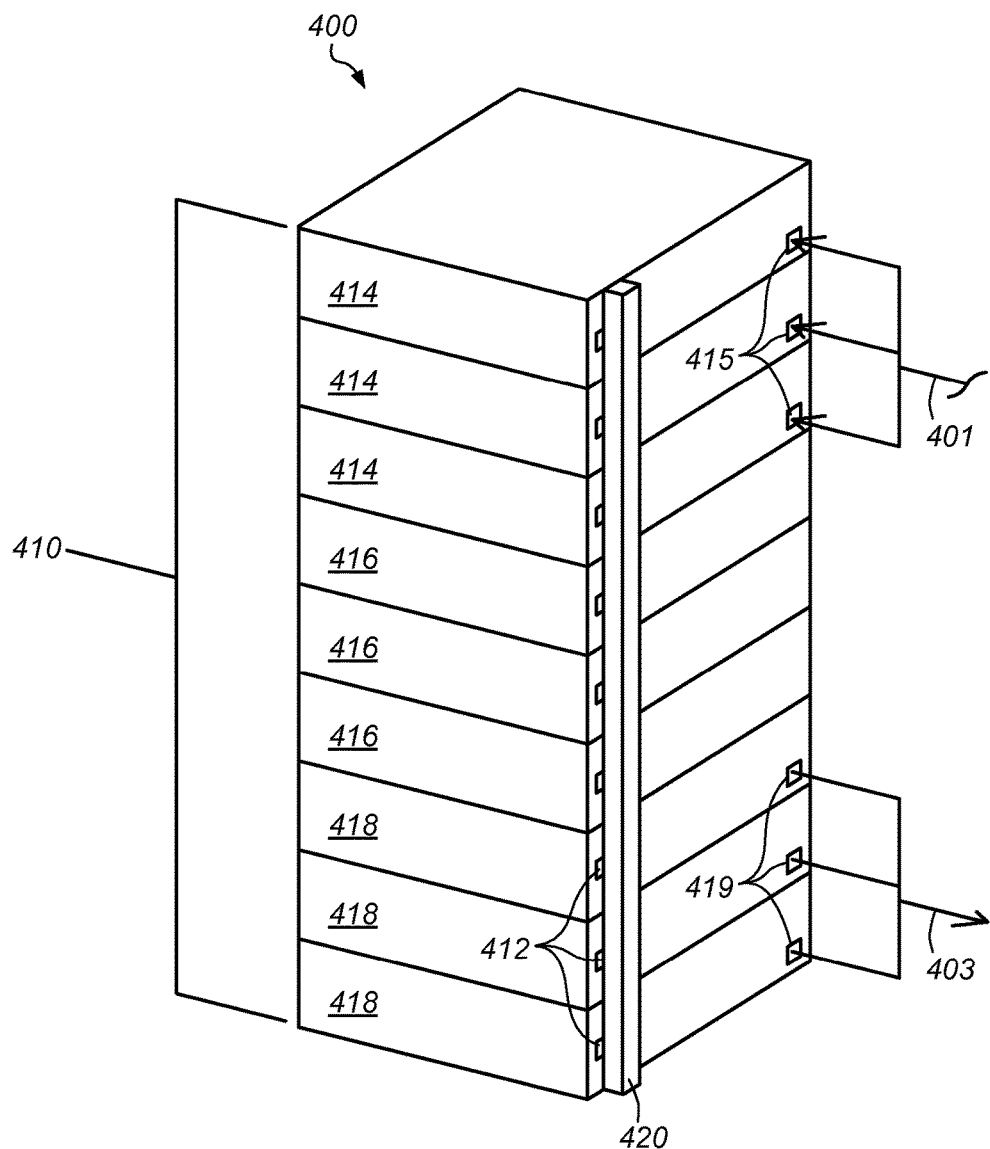
FIG. 4 illustrates a perspective view of a modular UPS which includes a set of UPS modules electrically coupled together via a common bus bar, according to some embodiments.

FIG. 4 illustrates a perspective view of a modular UPS which includes a set of UPS modules electrically coupled together via a common bus bar, according to some embodiments.

In some embodiments, a modular UPS includes a set of various UPS modules which are electrically coupled together via one or more bus bars. In some embodiments, the bus bars are configured to couple with the various UPS modules when the UPS modules are aligned with the bus bar in a particular configuration, so that the set of UPS modules coupled to the bus bar conforms to a particular form factor. The form factor can include a standardized rack computer system form factor. In some embodiments, to align the UPS modules and bus bars, the UPS modules and bus bars are coupled to a rack computer system frame in a particular configuration which aligns the UPS modules to conform to a rack computer system form factor when the UPS modules are coupled to the one or more bus bars.

In some embodiments, the UPS modules coupled to each other via one or more bus bars are electrically coupled to one or more various external components via one or more additional instances of power transmission lines. Such transmission lines can include one or more lines which supply electrical power from one or more external components to one or more UPS modules, one or more lines which supply electrical power to one or more external components from one or more UPS modules, some combination thereof, etc.

FIG. 4 shows a modular UPS 400 which includes a set 410 of UPS modules arranged in a configuration which conforms to at least one rack computer system form factor, such that the modular UPS 400 is configured to be installed in a rack position in a data center computer room adjacent to one or more rack computer systems which conform to at least one common rack computer system form factor.

UPS modules 410 include a set of rectifier modules 414, a set of battery modules 416, and a set of inverter modules 418. Each module 410 includes a connector 412 which is configured to couple with a bus bar 420, so that the respective module 410 is electrically coupled to, and is thus configured to supply or receive electrical power from, one or more other UPS modules 410 which are also coupled to the bus bar 420 via connectors 412 of the one or more other UPS modules 410.

As shown in the illustrated embodiment, each rectifier module 414 includes a respective power source connector 415 which is configured to couple with at least one power transmission lines 401 which carries electrical power from one or more power feeds. Thus, each rectifier module 414 is configured to receive AC electrical power from a power feed via connector 415 and supply converted DC electrical power to one or more other UPS modules 410 via the respective connector 412 and coupled bus bar 420.

As shown in the illustrated embodiment, each battery storage module 416 coupled to the bus bar 420 is configured to receive DC electrical power from the rectifier modules 414 via the bus bar 420 to which both modules 414, 416 are coupled. Where the rectifier modules continue to receive electrical power from lines 401 via connectors 415, modules 414 can continue to supply electrical power to bus bar 420, and the battery modules 416 can at least partially discharge stored electrical power to the bus bar 420 in response to the electrical power being supplied to the bus bar from modules 414 falling below a certain threshold amount. For example, in response to a total loss of the power feed from which modules 414 receive power via lines 401, the modules 414 can cease supplying power to the bus bar 420, and at least one of the battery modules 416 can respond to the loss of power supplied to the bus bar 420 from modules 414 by discharging at least some stored electrical power to maintain at least a certain amount of electrical power in the bus bar 420. In some embodiments, one or more of the battery modules 416 continuously receives and discharges electrical power, such that the discharge of electrical power is uninterrupted by a loss of electrical power supply to the bus bar 420 from modules 414.

As shown in the illustrated embodiment, each inverter module 418 coupled to the bus bar 420 is configured to receive DC electrical power from the bus bar 420 via a connector 412, convert the received DC power into AC power, and supply the converted AC power to one or more downstream rack computer systems via output connector 419 and one or more instances of distribution power transmission lines 403 which electrically couples the connector 419 to the downstream rack computer systems. As the inverter modules 418 are configured to receive electrical power from the bus bar 420, and both the rectifier modules 414 and the battery modules 416 are coupled to the bus bar 420, the inverter modules 418 can receive electrical power provided to the bus bar from one or more of the rectifier modules and battery modules, thereby providing an uninterruptible supply of AC power, to the coupled downstream rack computer systems, from one or more of the rectifier modules and battery modules.

In some embodiments, a modular UPS includes multiple inverter modules which are configured to supply synchronized AC power feeds in parallel, such that the synchronized parallel AC power feeds can be distributed via a common power feed. To supply synchronized AC power feeds, the multiple inverter modules can include one or more components which are configured to synchronize the power feeds supplied by each of the inverter modules. In the illustrated embodiment, for example, the inverter modules 418 can supply, via connectors 419, separate parallel and synchronized AC power feeds which are combined into a single AC power feed which is carried by one or more instances of distribution power transmission lines 403.

In some embodiments, a modular UPS includes multiple bus bars, where one bus bar electrically couples a set of UPS modules together and is further coupled to another bus bar which electrically couples another set of UPS modules together, such that the set of UPS modules and the other set of UPS modules are electrically coupled together via the coupled bus bars. For example, in the illustrated embodiment where the modular UPS 400 includes a vertically-oriented bus bar 420, one of the modules 416 can comprise a set of multiple UPS modules which are electrically coupled to a horizontally-oriented bus bar, where the horizontally oriented bus bar is coupled to the vertically-oriented bus bar via a connector 412, such that the multiple UPS modules are electrically coupled to bus bar 420 via the horizontally-oriented bus bar, and the multiple UPS modules are electrically coupled to the other UPS modules 410 in the UPS 400 via the coupled horizontally-oriented bus bar and the vertically-oriented bus bar 420. In some embodiments, the multiple UPS modules coupled to the bus bar, including a horizontally-oriented bus bar, which is coupled to bus bar 420 includes multiple different UPS modules.

Figure 5:
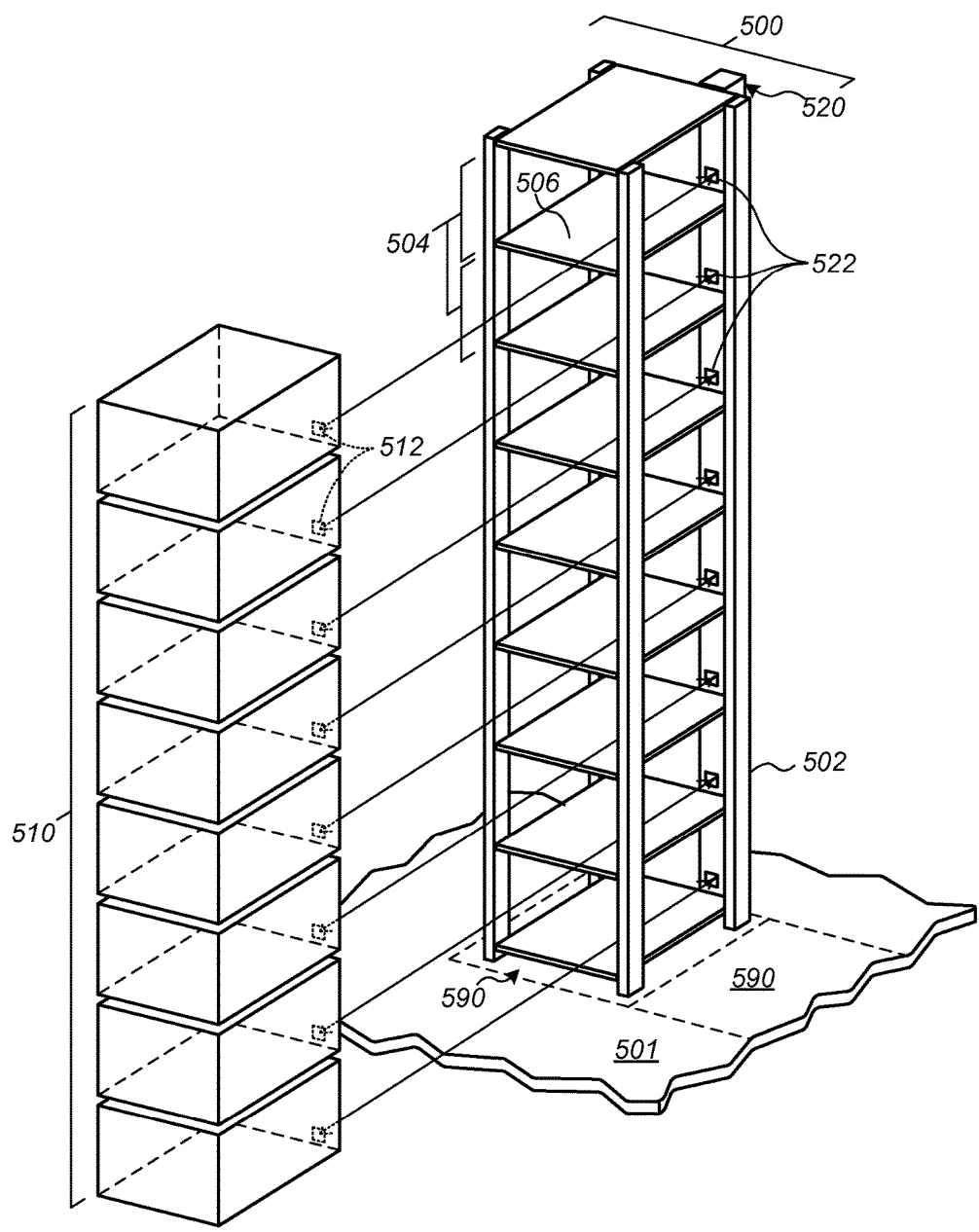
FIG. 5 illustrates a modular UPS which includes a rack computer system frame, a bus bar coupled to the frame, and a set of UPS modules which can be installed in the frame, according to some embodiments.

FIG. 5 illustrates a modular UPS which includes a rack computer system frame, a bus bar coupled to the frame, and a set of UPS modules which can be installed in the frame, according to some embodiments.

In some embodiments, a modular UPS includes a rack computer system frame, also referred to herein as a rack frame, which is configured to provide structural support to UPS modules which at least partially conform to a standard rack computer system form factor. The rack frame can include one or more sets of structural elements which configure the rack frame to structurally support one or more UPS modules in one or more rack positions in the rack frame. In some embodiments, the modular UPS includes a common bus bar which is coupled to the rack computer system frame in a particular configuration which aligns the bus bar to be electrically coupled with one or more DC connectors of one or more UPS modules based at least in part upon the UPS modules being mounted in one or more particular rack positions in the rack frame. As a result, the modular UPS can be configured to be installed in a rack position which is configured to accommodate one or more components conforming to a rack computer system form factor, including one or more rack computer systems.

In the illustrated embodiment, modular UPS 500 includes a rack frame 502, a set of UPS modules 510 and a bus bar 520. The rack frame 502 includes multiple structural elements 506, which in the illustrated embodiment include shelves, which separate the interior of the rack frame 502 into multiple separate rack positions 504 in which one or more separate UPS modules can be mounted. The bus bar 520 includes a set of bus bar connectors 522 and is coupled to the rack frame 502 in a particular configuration which aligns separate bus bar connectors 522 with separate rack positions 504, so that a given connector 522 aligned with a given position 504 is aligned with a connector 512 of a UPS module 510 mounted in that respective rack position 504. In some embodiments, the UPS module 510 DC connector 512 comprises a blind mate connector and the bus bar connector 522 comprises a blind mate connector, so that the connectors 512, 522 are coupled when the UPS module 510 is mounted in a given rack position 504 in which the connector 522 is included.

As shown, multiple separate UPS modules 510 can be mounted in separate rack positions 504 and coupled with the bus bar 520, via connectors 512, 522, so that the UPS modules 510 are electrically coupled together in parallel. In some embodiments, the UPS 500 includes one or more power feed connectors, distribution feed connectors, etc. In some embodiments, said connectors are included in one or more UPS modules.

As shown, the rack frame 502 conforms to a rack position 590 in a computer room 501 which is configured to accommodate multiple rack computer systems, where the multiple rack computer systems are also configured to conform to the rack positions 590.

In some embodiments, a modular UPS includes multiple rack frames in which multiple UPS modules are separately installed and electrically coupled via various instances of power transmission lines which extend between the separate rack frames.

Figure 6:
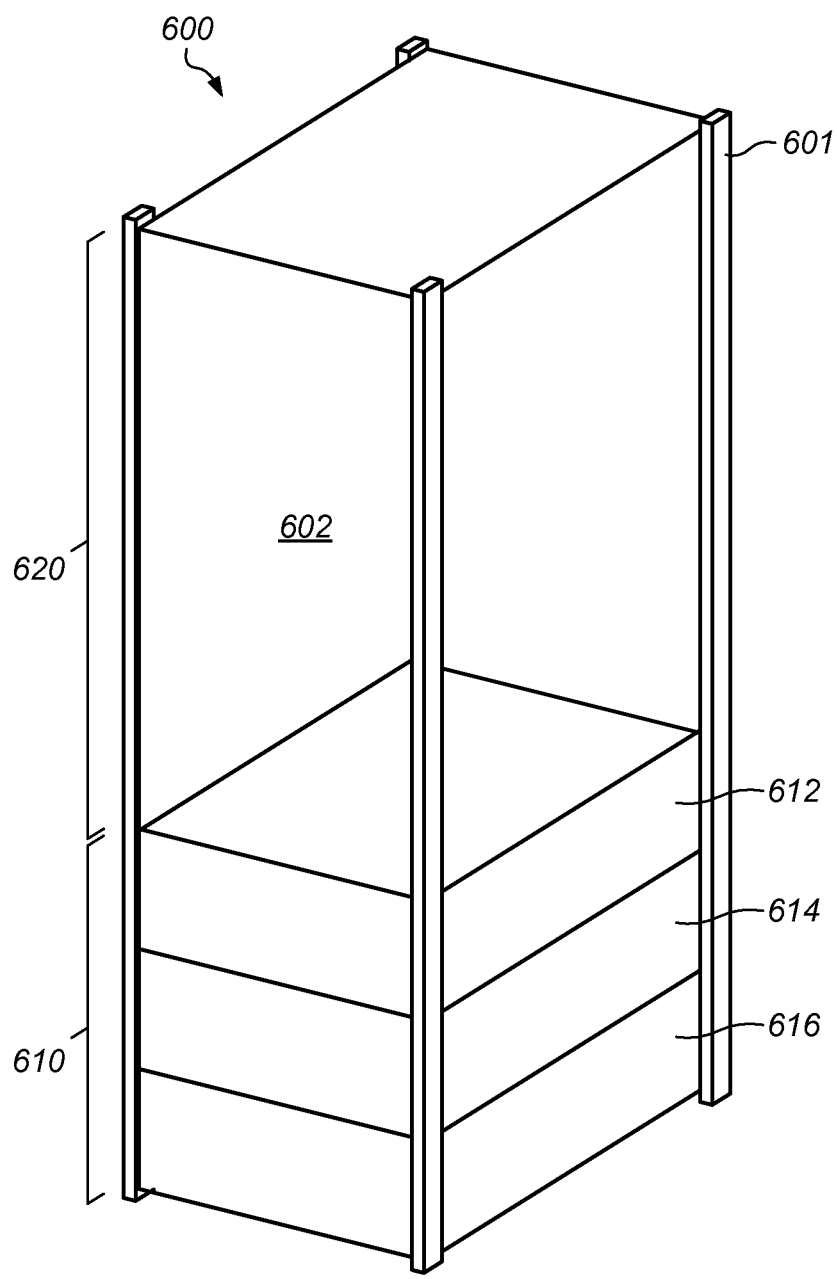
FIG. 6 illustrates a modular UPS which includes a set of UPS modules and an expansion region, according to some embodiments.

FIG. 6 illustrates a modular UPS which includes a set of UPS modules and an expansion region, according to some embodiments.

In some embodiments, a modular UPS which includes an interior space of a rack frame in which UPS modules are installed includes an expansion area which does not presently include UPS modules and in which additional UPS modules can be subsequently installed to augment the uninterruptible power support capacity of the modular UPS. In some embodiments, rack computer systems can be installed in the expansion area, as a result, the modular UPS can be configured to provide computing capacity.

In the illustrated embodiment, modular UPS 600 includes a rack frame 601 which includes an interior space 602. One portion 610 of the space 602 includes UPS modules 612, 614, 616 which collectively provide the uninterruptible power support capacity of the UPS 600. Another portion 620 of the space 602 comprises an empty expansion area which is configured to accommodate additional UPS modules which can be installed in the UPS 600 to adjust the uninterruptible power support capacity of the UPS 600. In some embodiments, the expansion area is configured to accommodate one or more computer systems which can provide computing capacity. For example, the UPS can include one or more power connectors, network communication connectors, etc. which are configured to provide power support, communication support, etc. to rack computer systems mounted in one or more positions in the space 602. In some embodiments, the UPS modules 612, 614, 616 are configured to provide uninterruptible power support to one or more rack computer systems installed in the expansion portion 620 of the interior space 602.

Figure 7:
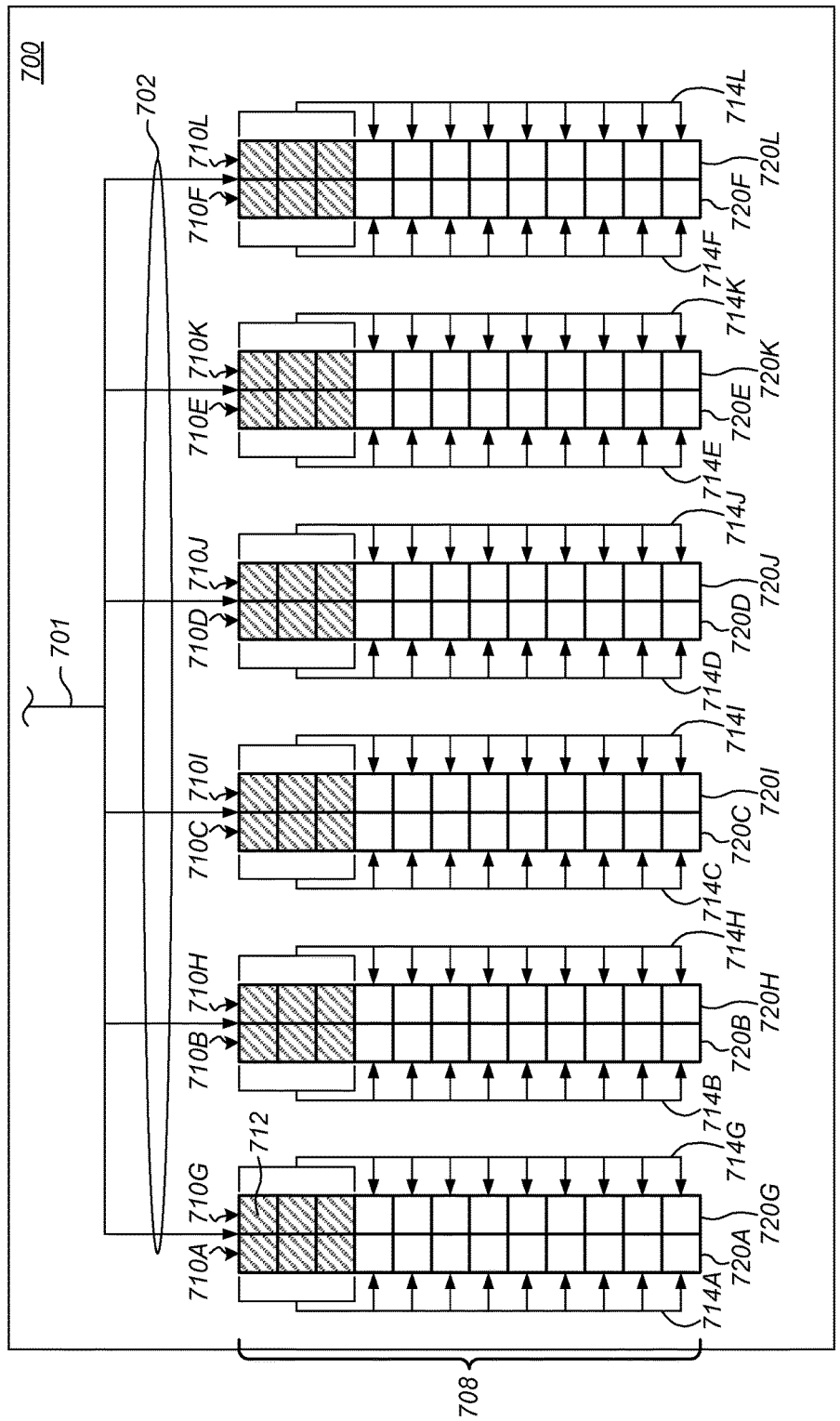
FIG. 7 is a schematic illustrating an overhead view of a computer room in which separate sets of modular UPSs provide uninterruptible power support to separate sets of rack computer systems, according to some embodiments.

FIG. 7 is a schematic illustrating an overhead view of a computer room in which separate sets of modular UPSs provide uninterruptible power support to separate sets of rack computer systems, according to some embodiments.

Computer room 700 includes multiple rows 708 of rack positions in which corresponding sets of rack computer systems 720A-L and modular UPSs 710A-L are installed, where the modular UPSs 710 installed in a given row 708 of rack positions are configured to provide uninterruptible power support to the rack computer systems 720 installed in the given row 708. For example, the modular UPSs 710A installed in a particular row 708 of rack positions in computer room 700 are configured to provide uninterruptible power support to the rack computer systems 720A installed in the same row 708. Similarly, the modular UPSs 710G installed in another particular row 708 of rack positions in computer room 700 are configured to provide uninterruptible power support to the rack computer systems 720G installed in the same row 708. The multiple UPSs 710 installed in a given row 708 can provide redundant uninterruptible power support to the rack computer systems installed in the same row 708. Each separate row 708 of rack computer systems can be referred to as a separate "set" of rack computer systems, so that the computer room includes multiple sets of rack computer systems and each individual set of modular UPSs 710 provides uninterruptible power support to a separate one of the sets of rack computer systems.

As shown, the computer room includes multiple power busways 714A-L which extend alongside separate sides of corresponding rows 708 and are configured to electrically couple the UPSs 710 and rack computer systems 720 installed in the respective rows 708, so that the UPSs 710 provide uninterruptible power support to the rack computer systems in a row 708 via a corresponding busway 714. Each set of UPSs 710 installed in the various rows 708 in the room 700 are configured to receive AC power from individual branch circuits 702 from a power feed 701 which is separate from the busways 714. The UPSs 710 can be electrically coupled in parallel with the feed 701 and, and each set of UPSs 710 installed in a given row 708 can be electrically coupled in parallel with the given busway 714 which extends along the given row.

In some embodiments, the quantity of rack frames installed in a row which include one or more UPS modules of one or more modular UPSs varies based on the uninterruptible power support requirements of the rack computer systems 720 installed in the given row 708. The various rack frames can include expansion areas which can accommodate additions, removals, etc. of various UPS modules which can result in dynamic adjustment of one or more of the power support redundancy, power support capacity, etc. of the set of UPSs 710 installed in a given row 708.

Figure 8:
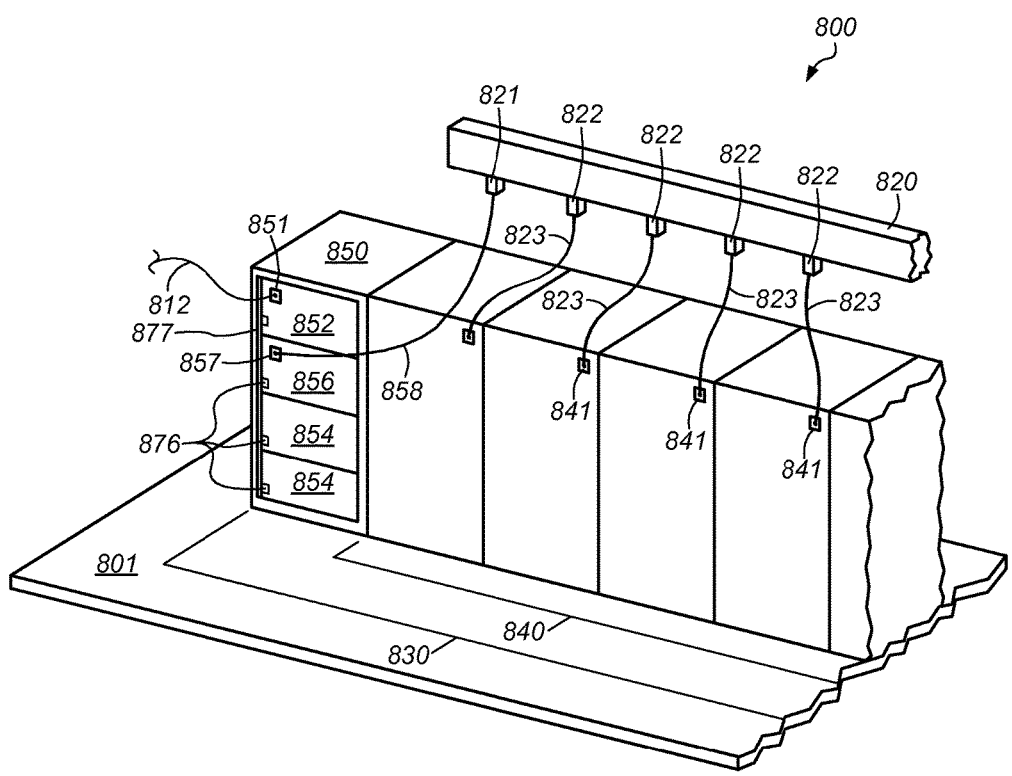
FIG. 8 illustrates a perspective view of a computer room which includes a modular UPS which receives power via a power feed busway and supplies power via a power distribution busway, according to some embodiments.

FIG. 8 illustrates a perspective view of a computer room which includes a modular UPS which receives power via a power feed busway and supplies power via a power distribution busway, according to some embodiments. The modular UPS illustrated in FIG. 8 can include any of the embodiments of modular UPSs encompassed herein.

Computer room 800 includes a row of occupied rack frames 830 installed on a floor space 801 of the computer room. The row of occupied rack frames includes a set of rack computer systems 840 and a modular UPS 850 which includes a rack frame in which separate electrically-coupled UPS modules 852, 854, 856 are installed. As shown, the rack computer systems 840 and modular UPS 850 are both configured to conform to a common rack computer system form factor, so that the modular UPS 850 and rack computer systems 840 can be installed in adjacent positions in the computer room 800.

In some embodiments, a modular UPS includes a set of UPS modules which are installed in separate rack positions in a common rack frame and are electrically coupled together via one or more instances of power transmission lines which extend between the separate UPS modules internally with respect to the common rack frame. The one or more instances of power transmission lines can include one or more common bus bars which are coupled to the common rack frame and configured to couple with one or more UPS modules based at least in part upon the one or more UPS modules being mounted in the common rack frame. The relative quantity and configurations of separate UPS modules 852, 856, 854 installed in the common rack frame can be adjusted based on the power support requirements of the rack computer systems 840. In the illustrated embodiment, for example, modular UPS 850 includes an individual rectifier module 852 which is installed in an upper rack position in the common rack frame of the UPS, an individual inverter module 856 installed in a central rack position in the common rack frame, and two battery modules 854 which are installed in two lower, adjacent rack positions in the common rack frame. Each individual module 852, 854, 856 can include a separate chassis and an adjustable quantity of sub-modules installed therein to configure the respective module to provide a certain amount of rectification capacity, electrical power storage and discharge capacity, and inversion capacity, respectively.

As shown, the rectifier module 852 includes a power feed connector 851 which is configured to electrically couple with one or more power feeds via one or more instances of power transmission lines 802. In some embodiments, the module 852 includes module connectors 851 which are each included on a separate sub-module and are each coupled to one or more power feeds.

As further shown, the inverter module 856 includes a power distribution connector 857 which is configured to electrically couple with the rack computer systems 840 via one or more instances of power transmission lines. In the illustrated embodiment, the connector 857 is coupled, via line 858 and busway connector 821, to the busway 820 to which each of the loads 840 are coupled, thereby electrically coupling the inverter module 856 to the loads 840 via the busway 820. The inverter module 856 can supply AC electrical power to the busway 820, and the power carried on the busway 820 can be supplied to the loads 840 via the busway connectors 822 and lines 823.

In some embodiments, each UPS module 852, 854, 856 includes one or more DC electrical connectors 876 which are configured to couple with one or more instances of power transmission lines 877 to electrically couple the modules together. For example, the rectifier module 852 can include a DC connector 876 which can be electrically coupled with one or more DC connectors 876 of one or more of the battery modules 854 to configure the battery modules 854 to receive and store DC power supplied by the rectifier module 852. In addition, the battery modules 854 can be coupled, via one or more DC connectors 876 and instances of power transmission lines 877, to the inverter module 856, so that the inverter module is configured to receive DC electrical power supplied by at least the battery modules 854, convert the power to AC power, and supply the converted AC power via at least connector 857. In some embodiments, the instances of power transmission lines 877 include one or more power cables, and the modules 852, 854, and 856 are coupled in series between separate types of UPS modules, so that the battery module 854 continuously supply, to the inverter module 856, electrical power which originates from one or more of power received from the rectifier module or power discharged from the battery modules. In some embodiments, the one or more instances of power transmission lines 877 which electrically couple the modules 852, 854, 856 includes one or more the common bus bars coupled to the common rack frame in which the modules are installed, where each separate module 852, 854, 856 is coupled to the bus bar via separate DC connectors, so that the rectifier supplies DC power to the bus bar, the battery modules receive and store DC power from the bus bar when the rectifier module is supplying power, the battery modules discharge DC power to the bus bar when the rectifier module at least partially fails to supply power to the bus bar, and the inverter module receives DC power, supplied by one or more of the rectifier module, battery modules, etc., via the bus bar.

The rack computer systems 840 are each coupled to a power busway 820 via separate instances of power transmission lines 823 which couple to separate busway connectors 822, thereby electrically coupling each of the rack computer systems 840 in parallel with the busway 820. The modular UPSs are each coupled in parallel to the same power busway 820 via separate distribution connectors 854 which are separately coupled, via separate instances of power transmission lines 822 and busway connectors 821. The inverter module 856 of the UPS 850 includes a power distribution connector 857 which is configured to supply AC power and is coupled to the busway 820 via one or more instances of power transmission lines 859 and busway connector 821. As a result, the modular UPS 850 can supply electrical power to the busway 820, and the power carried on the busway 820 can be collectively supplied to the rack computer systems 840 in parallel.

In some embodiments, the modular UPS 850 provides scalable and redundant uninterruptible power support to the rack computer systems 840, based at least in part upon the adjustable configuration of UPS modules 852, 854, 856 in the rack frame of the UPS 850. In some embodiments, the modular UPS 850 includes various sets of UPS modules which can be adjusted to adjustably configure the uninterruptible power support capacity of the UPS 850 based on the power support requirements of the loads 840.

In some embodiments, the modular UPS 850 is configured to supply AC electrical power to the busway 820, and the loads 840 are configured to receive AC electrical power from the busway. For example, in the illustrated embodiment, the modular UPS 850 includes an inverter module 856 which converts electrical power received from one or more of the rectifier module 852, battery modules 854, etc. via one or more instances of power transmission lines in the common rack frame into AC electrical power and is further configured to supply the AC electrical power to the loads 840 via busway 820. In some embodiments, the modular UPS 850 is configured to supply DC electrical power to the busway 820. The modular UPS 850 can be configured to supply DC electrical power based at least in part upon the rack computer systems 840 being configured to receive DC electrical power instead of AC electrical power. For example, the rack computer systems 840 can each include respective inverter modules which convert electrical power received at the respective electrical load into AC electrical power. The inverter module 856 can be omitted from the modular UPS 850, and one or more of the rectifier module 852, battery module 854, some combination thereof, etc. can be coupled to the busway 820 which is coupled to the rack computer systems 840, so that electrical power discharged from one or more of the rectifier module 852 and battery module 854 included in the UPS is the DC electrical power carried on the busway 820 and supplied to the loads 840.

Figure 9:
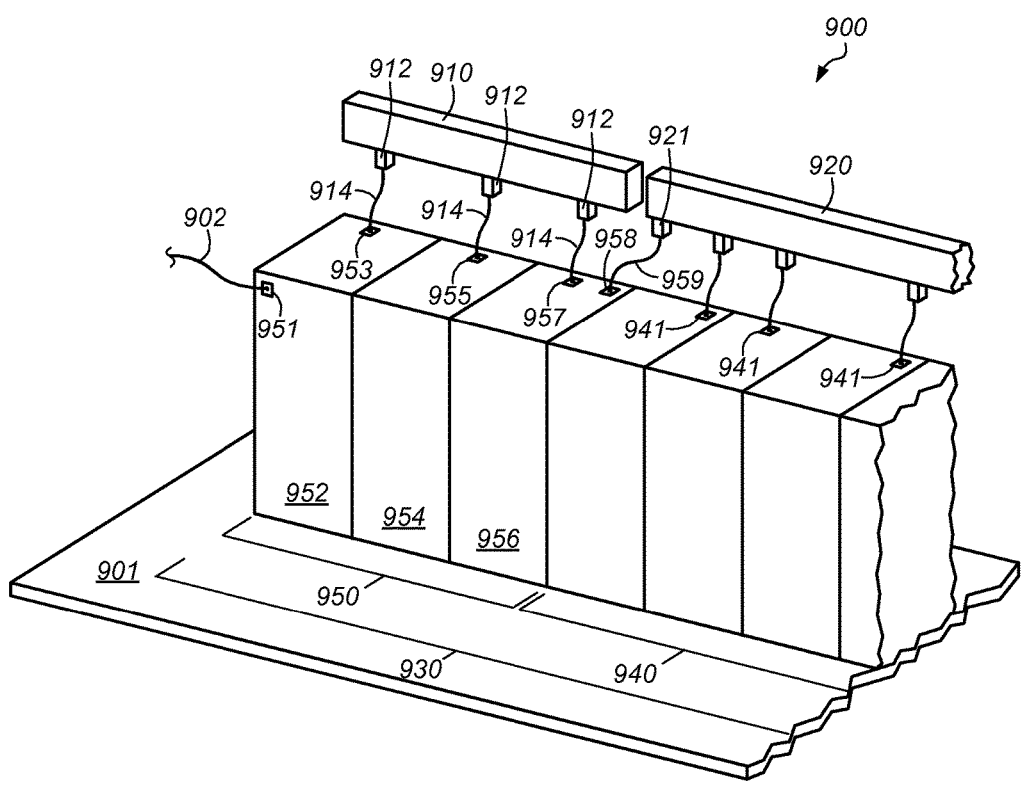
FIG. 9 illustrates a perspective view of a computer room which includes a modular UPS comprising a set of UPS modules installed in separate rack frames and electrically coupled via a common busway and which supplies power to rack computer systems via a power distribution busway, according to some embodiments.

FIG. 9 illustrates a perspective view of a computer room which includes a modular UPS comprising a set of UPS modules installed in separate rack frames and electrically coupled via a common busway and which supplies power to rack computer systems via a power distribution busway, according to some embodiments. The modular UPS illustrated in FIG. 9 can include any of the embodiments of modular UPSs encompassed herein.

Computer room 900 includes a row of occupied rack frames 930 installed on a floor space 901 of the computer room. The row of occupied rack frames includes a set of rack computer systems 940 and a modular UPS 950 which includes a set of rack frames 952-956 which include separate UPS modules and an external power busway 910 which electrically couples the separate modules in the separate frames. As shown, the rack computer systems 940 and modular UPS rack frames 952-956 are both configured to conform to a common rack computer system form factor, so that the modular UPS rack frames 952-956 and rack computer systems 940 can be installed in adjacent positions in the computer room 900.

In some embodiments, a modular UPS includes a set of UPS modules which are installed in separate rack frames and are electrically coupled together via one or more instances of power transmission lines which extend externally between the separate rack frames. Separate sets of separate UPS modules can be installed in separate rack frames, and the quantity of UPS modules installed in each separate rack frame can be adjusted based on the power support requirements of the rack computer systems 940. In the illustrated embodiment, for example, modular UPS 950 includes a rectifier module 952 which conforms to a standard rack form factor, a battery module 954 which conforms to the same form factor, and an inverter module which conforms to the same standard form factor. Each individual UPS module 952, 954, 956 can include a separate rack frame and an adjustable quantity of sub-modules installed therein which configure the respective UPS module to provide a certain amount of rectification capacity, electrical power storage and discharge capacity, and inversion capacity, respectively.

As shown, the rectifier module 952 includes a power feed connector 951 which is configured to electrically couple with one or more power feeds via one or more instances of power transmission lines 902. The power feed connector 951 can be coupled to the rack frame separately from one or more rectifier sub-modules included in the module 952. In some embodiments, the module 952 includes module connectors 951 which are each included on a separate sub-module and are each coupled to one or more power feeds.

As further shown, each module 952, 954, 956 includes a DC electrical connector 953, 955, 957 which is configured to couple with the common bus bar 910, via separate instances of power transmission lines 914 and busway connectors 912, to electrically couple the modules 952, 954, 956 together. Where each module includes multiple sub modules, the respective module can include multiple DC connectors, where each DC connector is located on a separate sub-module and is separately coupled to the busway. In some embodiments, a busway 910 is absent, and the modules 952, 954, 956 are electrically coupled together via separate instances of power transmission lines, including cabling, which couple various connectors on the separate modules.

The rack computer systems 940 are each coupled to a power busway 920 via separate instances of power transmission lines 925 which couple to separate busway connectors, thereby electrically coupling each of the rack computer systems 940 in parallel with the busway 920. The modular UPSs are each coupled in parallel to the same power busway 920 via separate distribution connectors 954 which are separately coupled, via separate instances of power transmission lines 922 and busway connectors 921. The inverter module 956 of the UPS 950 includes a power distribution connector 958 which is configured to supply AC power and is coupled to the busway 920 via one or more instances of power transmission lines 959 and busway connector 921. As a result, the modular UPS 950 can supply AC electrical power to the busway 920, and the power carried on the busway 920 can be collectively supplied to the rack computer systems 940 in parallel.

In some embodiments, the modular UPS 950 is configured to supply AC electrical power to the busway 920, and the rack computer systems 940 are configured to receive AC electrical power from the busway. For example, in the illustrated embodiment, the modular UPS 950 includes an inverter module 956 which converts electrical power received from one or more of the rectifier 952, battery module 954, etc. via the busway 910 into AC electrical power and is further configured to supply the AC electrical power. In some embodiments, the modular UPS 950 is configured to supply DC electrical power to the busway 920. The modular UPS 950 can be configured to supply DC electrical power based at least in part upon the rack computer systems 940 being configured to receive DC electrical power instead of AC electrical power. For example, the rack computer systems 940 can each include respective inverter modules which convert electrical power received at the respective electrical load into AC electrical power. The inverter 956 and busway 910 can be omitted from the modular UPS 950, and the rectifier module 952 and battery module 954 can both be coupled to the busway 920 which is coupled to the loads 940, so that electrical power discharged from one or more of the rectifier module 952 and battery module 954 included in the UPS is the DC electrical power carried on the busway 920 and supplied to the rack computer systems 940.

Figure 10:
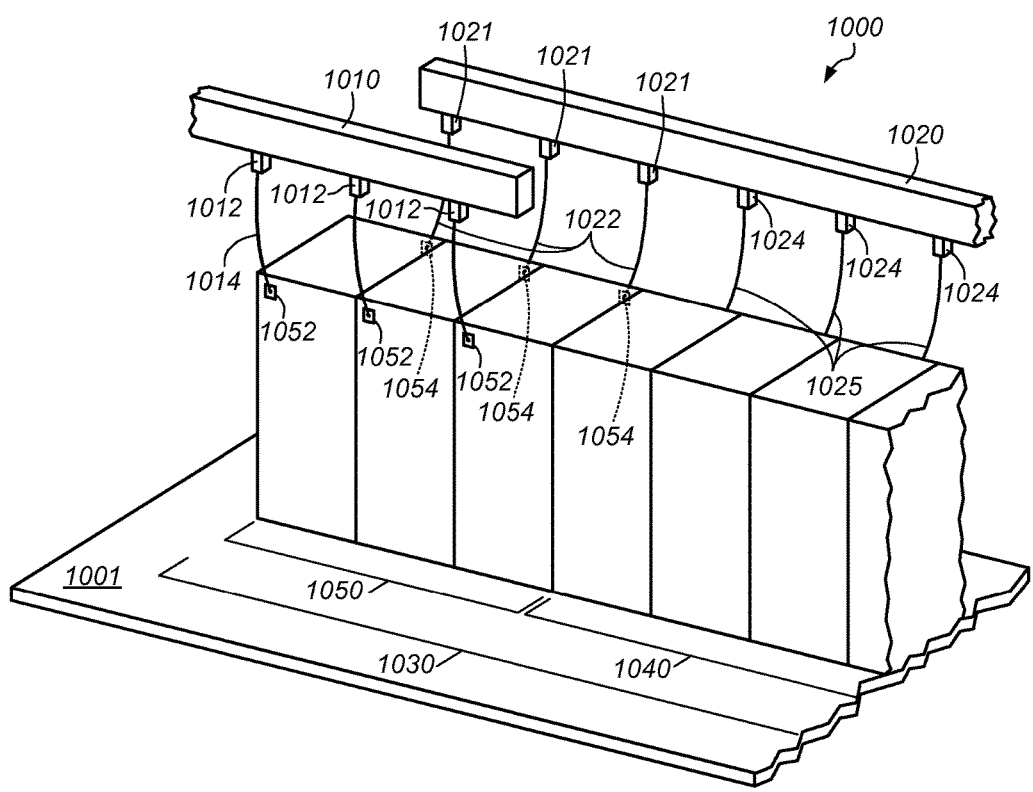
FIG. 10 illustrates a perspective view of a computer room which includes a set of modular UPSs configured to provide redundant uninterruptible power support to a set of rack computer systems, according to some embodiments.

FIG. 10 illustrates a perspective view of a computer room which includes a set of modular UPSs configured to provide redundant uninterruptible power support to a set of rack computer systems, according to some embodiments. The modular UPSs illustrated in FIG. 10 can include any of the embodiments of modular UPSs encompassed herein.

Computer room 1000 includes a row of occupied rack frames 1030 installed on a floor space 1001 of the computer room. The row of occupied rack frames includes a set of rack computer systems 1040 and a set of modular UPSs 1050. As shown, the rack computer systems 1040 and modular UPSs 1050 are both configured to conform to a common rack computer system form factor, so that the modular UPSs 1050 and rack computer systems 1040 can be installed in adjacent positions in the computer room 1000.

The modular UPSs 1050 are each coupled to a common power feed carried in a power feed busway 1010, via separate respective feed connectors 1052 which are coupled to separate instances of power transmission lines 1014 and busway connectors 1012. In some embodiments, separate UPSs are coupled to separate power feeds, via separate busways, instances of power transmission lines, some combination thereof, etc.

The rack computer systems 1040 are each coupled to a power busway 1020 via separate instances of power transmission lines 1025 which couple to separate busway connectors, thereby electrically coupling each of the rack computer systems 1040 in parallel with the busway 1020. The modular UPSs are each coupled in parallel to the same power busway 1020 via separate distribution connectors 1054 which are separately coupled, via separate instances of power transmission lines 1022 and busway connectors 1021. As a result, the modular UPSs 1050 can collectively supply electrical power to the busway 1020, and the power carried on the busway 1020 can be collectively supplied to the rack computer systems 1040 in parallel. In some embodiments, the set of modular UPSs 1050 provide redundant uninterruptible power support to the rack computer systems 1040, based at least in part upon the parallel coupling of the UPSs 1050 to the busway 1020. Each separate UPS 1050 can operate independently and continue to provide uninterruptible power support in the event that one or more other UPSs 1050 should fail to supply power to the busway. In some embodiments, each modular UPS 1050 includes various sets of UPS modules which can be adjusted to adjustably configure the uninterruptible power support capacity of the UPS 1050 based on the power support requirements of the loads 1040.

In some embodiments, the modular UPSs 1050 are configured to supply AC electrical power to the busway 1020, and the rack computer systems 1040 are configured to receive AC electrical power from the busway. In some embodiments, the modular UPSs 1050 are configured to supply AC electrical power based at least in part upon installing one or more inverter modules in each of the modular UPSs.

In some embodiments, the modular UPSs 1050 are configured to supply DC electrical power to the busway 1020. The modular UPSs 1050 can be configured to supply DC electrical power based at least in part upon the rack computer systems 1040 being configured to receive DC electrical power instead of AC electrical power. For example, the rack computer systems 1040 can each include respective inverter modules which convert electrical power received at the respective electrical load into AC electrical power. A modular UPS 1050 can be configured to supply DC electrical power based at least in part upon omitting inverter modules from the modular UPS, so that electrical power discharged from the one or more battery modules included in the UPS is the DC electrical power supplied by the modular UPS.

Figure 11:
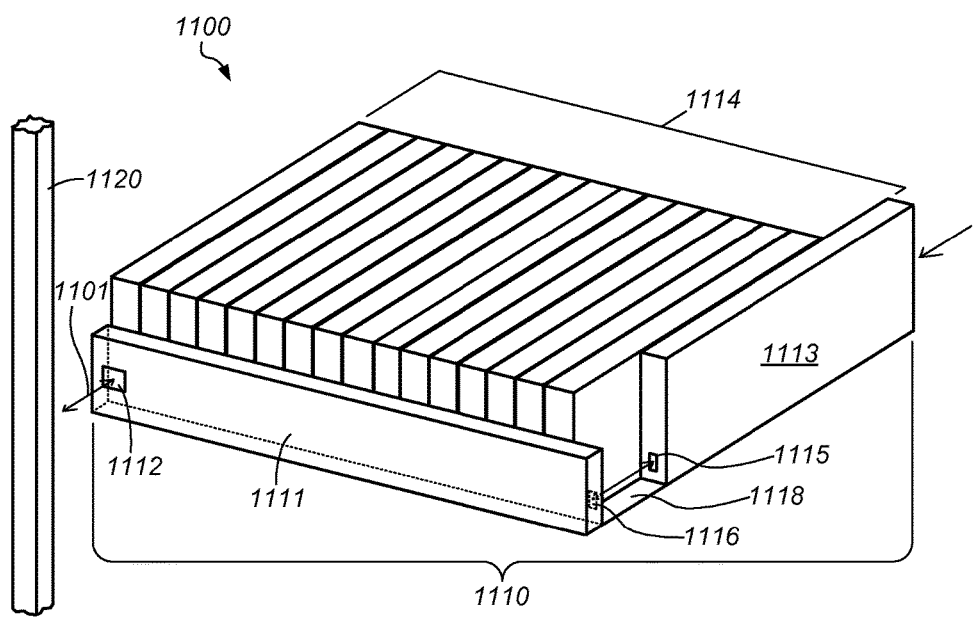
FIG. 11 illustrates a perspective view of a UPS module which includes a chassis, backplane, and a set of sub-modules, according to some embodiments.

FIG. 11 illustrates a perspective view of a UPS module which includes a chassis, backplane, and a set of sub-modules, according to some embodiments.

In some embodiments, a UPS module which is configured to provide functionality which includes at least one of power rectification, electrical power storage, electrical power inversion, etc. comprises at least one set of sub-modules, where the sub-modules are individually configured to provide at least a limited portion of the functionality of the UPS module and collectively provide the entirety of the functionality. The UPS module can include a chassis which structurally supports the sub-modules within the UPS module. The UPS module can include a backplane which electrically couples the sub-modules in parallel. The backplane can include a set of sub-module connectors which can each couple with a separate submodule, an electrical connector which is configured to electrically couple with at least one other UPS module, and electrical circuitry which electrically couples the sub-module connectors in parallel with the electrical connector of the backplane, such that the set of sub-modules, when coupled with the sub-module connectors of the backplane, are collectively coupled in parallel with the at least one other UPS module.

In some embodiments, the quantity of sub-modules installed in the UPS module can be adjusted, so that the UPS module functionality of the UPS module is correspondingly adjusted. Such adjustment can be implemented so that the excess UPS module functionality over the amount of functionality required to enable a modular UPS in which the UPS module is included to at least meet the power support requirements of a set of downstream rack computer systems is minimized, thereby optimizing the allocation of resources. Sub-modules, in some embodiments, can be "hot swapped" from the UPS module chassis, so that sub-modules can be added, removed, etc. while the UPS module is presently providing the UPS module functionality collectively provided by the installed sub-modules.

FIG. 11 illustrates a UPS module system 1100 which includes a UPS module 1110 and a bus bar 1120 to which the UPS module 1110 can be coupled 1101 to electrically couple the UPS module 1110 to the bus bar 1120 and enable the UPS module 1110 to provide at least one instance of UPS module functionality via the bus bar 1120. UPS module 1110 includes a set 1114 of UPS sub-modules 1113 which collectively provide the UPS module functionality of the UPS module.

The UPS module 1110 includes a backplane 1111 which can electrically couple the sub-modules 1113 in parallel with an electrical connector 1112 which is configured to be coupled 1101 with the bus bar 1120, thereby electrically coupling the collective set 1114 of sub-modules 1113 with the bus bar 1120. The backplane includes a set of sub-module connectors 1116 which are each configured to couple with a corresponding connector 1115 of one or more corresponding sub-modules 1116. The backplane 1111 includes one or more instances of electrical circuitry which electrically couple the set of connectors 1116 to the connector 1112, such that each sub-module 1113 coupled to a connector 1116 on the backplane 1111 is electrically coupled to the connector 1112.

The UPS module 1110 includes a chassis 1118 which provides structural support to the sub-modules 1113, such that the sub-modules 1113 maintain a particular structural configuration and arrangement when the sub-modules 1113 are coupled to the backplane 1111.

In some embodiments, a modular UPS includes multiple UPS modules which are configured to be installed in a common rack position of a rack frame, including the rack position 504 included in the rack frame 502 of the UPS 500 illustrated in FIG. 5. For example, in some embodiments multiple separate UPS modules 1114 which are configured to be mounted in a common rack position 504 of a rack frame 502 and which are electrically coupled to each other in parallel via a common bus bar, shown by element 1111 in FIG. 11, where the bus bar 1111 is coupled to another bus bar 1120 which is electrically coupled to other UPS modules installed in other rack positions 504 of the rack frame 502.

In some embodiments, the separate UPS modules 1114 can include different sets of UPS modules which each provide different UPS functionalities. For example, one UPS module 1114 coupled to the bus bar 1111 can be a rectifier module and another UPS module 1114 coupled to the same bus bar 1111 can be a battery module.

In some embodiments, where element 1111 in FIG. 11 is a bus bar configured to couple to multiple UPS modules in parallel, the bus bar 1111 can extend along a full width of a rack frame to which the bus bar 1111 is coupled, a full depth of a rack frame to which the bus bar 1111 is coupled, some combination thereof, etc., so that the bus bar 1111 is configured to electrically couple, in parallel, with a set of UPS modules 1114 which can collectively extend along one or more of the full width of the rack frame along which the bus bar 1111 extends, the full depth of the rack frame along which the bus bar 1111 extends, etc.

Thus, in some embodiments, a rack frame, including the rack frame 502 illustrated in FIG. 5, can include multiple vertically-arranged rack positions, including the positions 504 illustrated in FIG. 5, where a horizontally-oriented bus bar 1111 is coupled to the rack frame 502 in a position such that the bus bar 1111 is configured to couple with multiple UPS modules 1114 mounted in a particular rack position 504, such that the multiple UPS modules extend along at least one of the full width or the full depth of the rack frame 502 and the bus bar 1111 is coupled to the bus bar 1120, which can include the bus bar 520 illustrated in FIG. 5, such that the multiple UPS modules coupled to the horizontally-oriented bus bar 1111 are electrically coupled to at least the bus bar 520 via the horizontally-oriented bus bar 1111.

Figure 12:
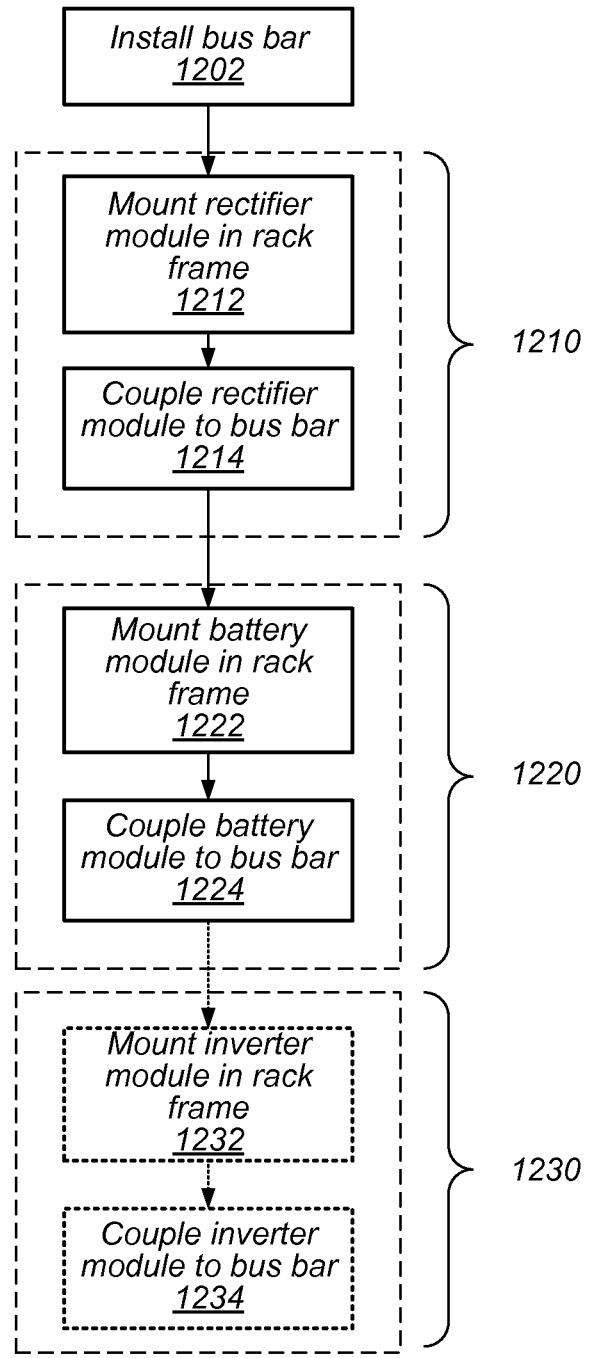
FIG. 12 illustrates providing a modular UPS via installation of UPS modules in one or more rack computer system frames, according to some embodiments.

FIG. 12 illustrates providing a modular UPS via installation of UPS modules in one or more rack computer system frames, according to some embodiments. The configuring can be implemented with regard to any of the embodiments of modular UPSs described herein.

At 1202, one or more bus bars are installed in at least one rack computer system frame. Such installation can include coupling a bus bar in a particular arrangement along one or more sides of a rack computer system frame which configures one or more electrical connectors of the bus bar to be aligned with one or more shelf positions in the rack frame, such that a UPS module mounted in the one or more shelf positions is aligned to be coupled, at a connector of the UPS module, with the connector of the bus bar.

At 1210, one or more rectifier modules are installed in the rack frame. The quantity of rectifier modules and the amount of electrical power which the rectifier modules are configured to receive and rectify, can be predetermined based at least in part upon the power support requirements of a set of downstream rack computer systems to which the modular UPS is to be electrically coupled and provide uninterruptible power support. As shown at 1212 and 1214, the installing includes mounting the one or more rectifier modules in one or more rack positions in a rack frame, such that the rack frame structurally supports the one or more rectifier modules, and coupling the mounted one or more rectifier modules to the bus bar, such that the one or more rectifier modules are electrically coupled to the bus bar.

At 1220, one or more battery modules are installed in the rack frame. The quantity of battery modules and the amount of electrical power which the battery modules are configured to store and discharge can be predetermined based at least in part upon the power support requirements of a set of downstream rack computer systems to which the modular UPS is to be electrically coupled and provide uninterruptible power support. As shown at 1222 and 1224, the installing includes mounting the one or more battery modules in one or more rack positions in a rack frame, such that the rack frame structurally supports the one or more battery modules, and coupling the mounted one or more battery modules to the bus bar, such that the one or more battery modules are electrically coupled to the bus bar. Coupling the one or more battery modules to the bus bar can include electrically coupling the one or more battery modules to the installed one or more rectifier modules via the bus bar, such that the installed battery modules are configured to store and discharge direct-current electrical power received from the one or more rectifier modules.

At 1230, one or more inverter modules are installed in the rack frame. The quantity of inverter modules and the amount of received electrical power which the inverter modules are configured to convert and supply, can be predetermined based at least in part upon the power support requirements of a set of downstream rack computer systems to which the modular UPS is to be electrically coupled and provide uninterruptible power support. As shown at 1232 and 1234, the installing includes mounting the one or more inverter modules in one or more rack positions in a rack frame, such that the rack frame structurally supports the one or more inverter modules, and coupling the mounted one or more inverter modules to the bus bar, such that the one or more inverter modules are electrically coupled to the bus bar. Coupling the one or more inverter modules to the bus bar can include electrically coupling the one or more inverter modules to the installed one or more rectifier modules and the installed one or more battery modules via the bus bar, such that the installed inverter modules are configured to store and discharge direct-current electrical power received from at least one of the one or more rectifier modules, the one or more battery modules, some combination thereof, etc.

In some embodiments, 1230 is omitted, so that the modular UPS is configured to provide direct-current uninterruptible power support. For example, where the modular UPS is being configured to provide uninterruptible power support to a set of rack computer systems which are configured to receive direct-current electrical power, the modular UPS can include rectifier modules and battery modules but not inverter modules. In another example, where the modular UPS is being configured to provide uninterruptible power support to a set of rack computer systems which are configured to receive alternating-current electrical power, the modular UPS can include inverter modules in addition to rectifier modules and battery modules.

Figure 13:
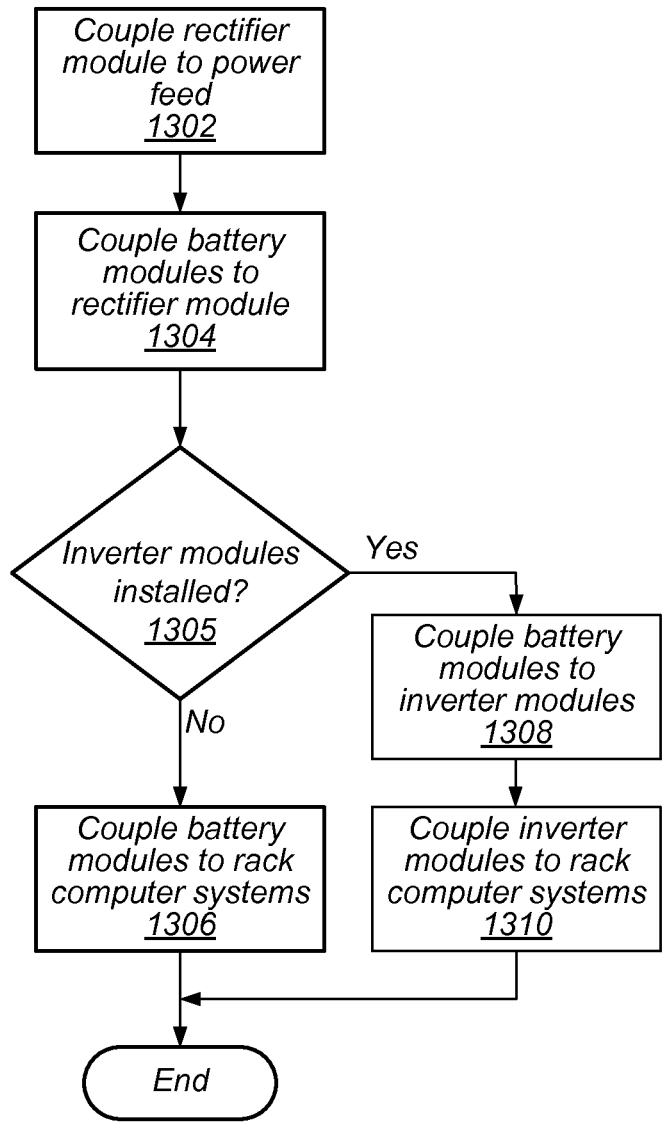
FIG. 13 illustrates configuring a power distribution system to provide uninterruptible power support via one or more modular UPSs, according to some embodiments.

FIG. 13 illustrates configuring a power distribution system to provide uninterruptible power support via one or more modular UPSs, according to some embodiments. The configuring can be implemented with regard to any of the embodiments of modular UPSs described herein.

At 1302, one or more rectifier modules are coupled to one or more power sources, such that the one or more rectifier modules can receive power from the one or more power sources. Such coupling can include coupling one or more power input connectors of the one or more rectifier modules to one or more instance of power transmission lines which carry electrical power from one or more power sources. For example, a rectifier module can be coupled to a power feed busway which carries alternating current power supplied by one or more power sources. Such power sources can include one or more utility power sources, one or more reserve power sources, some combination thereof, etc. As a result of such coupling, the rectifier module can convert alternating-current power, received from a power source via one or more instances of power transmission lines, to direct-current electrical power which can be discharged from the rectifier modules via one or more electrical output connectors of the rectifier modules.

At 1304, one or more battery modules are coupled to the one or more rectifier modules, such that the rectifier modules and battery modules are electrically coupled and the battery modules are configured to receive and store direct-current electrical power discharged from the one or more rectifier modules. Such coupling can include coupling one or more electrical power connectors of the one or more battery modules to the one or more electrical output connectors of the rectifier modules via one or more instances of power transmission lines. Such power transmission lines can include one or more common bus bars which are configured to carry direct-current electrical power, such that coupling the one or more battery modules to the one or more rectifier modules includes coupling the electrical output connectors of the rectifier modules to the common bus bar and coupling the electrical connectors of the battery modules to the common bus bar, such that the rectifier modules and battery modules are electrically coupled to the common bus bar.

At 1305 and 1306, if no inverter modules are installed in the modular UPS, the one or more battery modules are coupled to one or more sets of downstream rack computer systems, via one or more instances of power transmission lines, such that the battery modules are configured to supply direct-current electrical power to the one or more sets of downstream rack computer systems. Such coupling can include coupling one or more electrical connectors of the battery modules to one or more instances of power transmission lines which are coupled to one or more power input connectors of the rack computer systems, such that the battery modules are electrically coupled to the rack computer systems via the power transmission lines. The power transmission lines can include one or more bus bars, which can be separate from one or more bus bars which electrically couple the rectifier and battery modules. The battery modules can be configured to supply at least some electrical power received from the rectifier modules to the rack computer systems and, in response to at least a partial loss of electric al power from the rectifier modules, discharge stored electrical power to the rack computer systems via the one or more instances of power transmission lines, thereby providing uninterruptible power support to the rack computer systems.

In some embodiments, a modular UPS is configured to provide alternating-current uninterruptible power support. Such configuring, shown at 1305-1310, includes coupling, at 1308, one or more inverter modules to the one or more battery modules, via one or more instances of power transmission lines, such that the inverter modules are electrically coupled to the battery modules. In some embodiments, where the rectifier modules and battery modules are coupled to a common bus bar, coupling the inverter modules to the battery modules can include coupling one or more electrical input connectors of the inverter modules to the common bus bar, such that the inverter modules, rectifier modules, and battery modules are electrically coupled to each other via the common bus bar. Such coupling of the inverter modules to the battery modules configured the inverter modules to receive direct-current electrical power from the battery modules and convert the received electrical power to alternating-current electrical power. The configuring can further include, at 1310, coupling the one or more inverter modules to one or more sets of downstream rack computer systems, which can include one or more rack computer systems, via one or more instances of power transmission lines, such that the inverter modules are configured to supply alternating-current electrical power, converted from direct-current electrical power received from the one or more battery modules, to the one or more sets of downstream rack computer systems. Such coupling can include coupling one or more electrical output connectors of the inverter modules to one or more instances of power transmission lines which are coupled to one or more power input connectors of the rack computer systems, such that the inverter modules are electrically coupled to the rack computer systems via the power transmission lines and the battery modules are electrically coupled to the rack computer systems via at least the inverter modules. The power transmission lines can include one or more bus bars, which can be separate from one or more bus bars which can electrically couple the rectifier, battery, and inverter modules.

Figure 14:
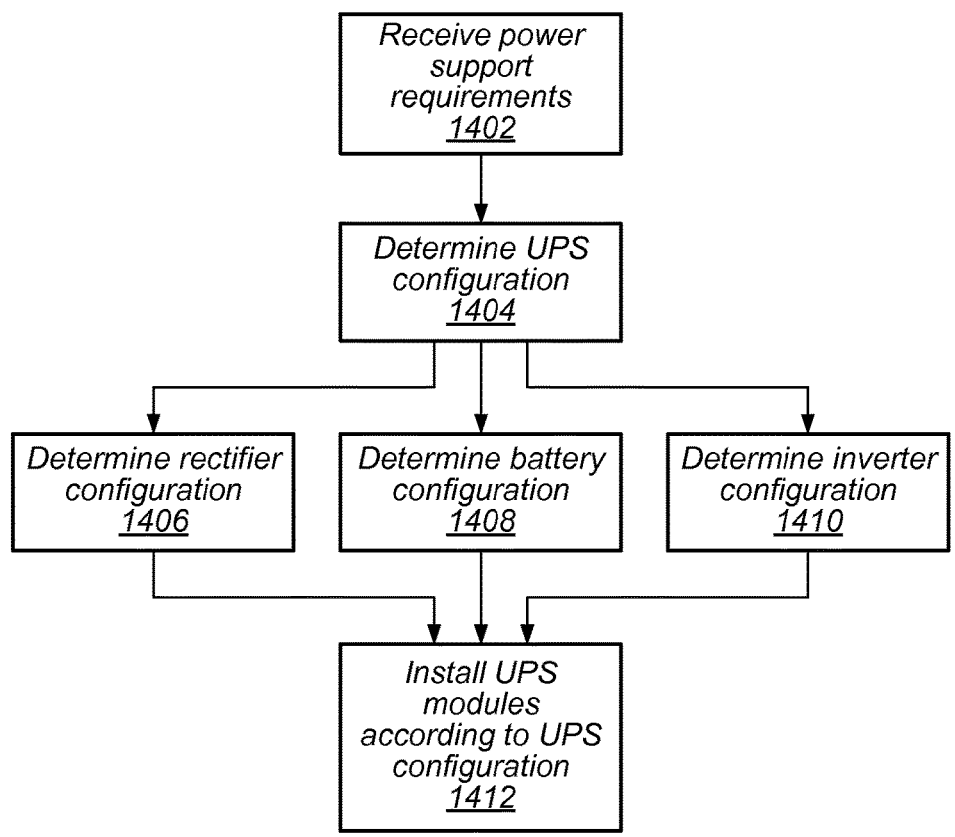
FIG. 14 illustrates configuring a modular UPS to provide scalable uninterruptible power support based on power support requirements associated with one or more downstream rack computer systems, according to some embodiments.

FIG. 14 illustrates configuring a modular UPS to provide scalable uninterruptible power support based on power support requirements associated with one or more downstream rack computer systems, according to some embodiments. The configuring can be implemented by one or more computer systems, as described further below.

At 1402, one or more sets of power support requirements associated with a set of rack computer systems are received. A set of power support requirements regarding a set of rack computer systems can be received from the set of rack computer systems via one or more communication pathways, from one or more other computer systems, some combination thereof, etc. A set of power support requirements can include data indicating a threshold amount of uninterruptible electrical power support which is required by the set of rack computer systems to support at least a certain threshold level of functionality. In some embodiments a set of power support requirements can include data indicating a level of power support redundancy (e.g., 2N, 3N, N+1, etc.) required for the set of rack computer systems.

At 1404, based at least in part upon the received power support requirements for the set of rack computer systems, a modular UPS configuration is determined, for one or more modular UPSs, which at least meets the power support requirements for the set of rack computer systems. A modular UPS configuration can include a particular quantity and connection arrangement of modular UPSs which at least meet the power support requirements. For example, where the power support requirements for a set of rack computer systems includes data specifying a certain threshold amount of 50 KWa of uninterruptible power support capacity and also specifies 2N uninterruptible power support redundancy, determining a UPS configuration which at least meets the power support requirements can include establishing a configuration which comprises a set of at least two modular UPSs, each configured to provide at least 50 KWa of uninterruptible power support and electrically coupled in parallel to the set of rack computer systems.

In some embodiments, establishing a UPS configuration can include establishing a configuration of one or more sets of UPS modules which, when electrically coupled together, comprise one or more modular UPSs which provide at least a threshold amount of uninterruptible power support, at least a certain level of power support redundancy, some combination thereof, etc.

At 1406, a configuration of rectifier modules which collectively provides at least a certain amount of rectification functionality is determined. The configuration can include a determined quantity of predetermined rectifier modules which, when electrically coupled in parallel, are configured to rectify at least a certain threshold amount of electrical power which at least meets the power support requirements of the rack computer systems.

At 1408, a configuration of battery modules which collectively provides at least a certain amount of electrical power storage and supply functionality is determined. The configuration can include a determined quantity of predetermined battery modules which, when electrically coupled in parallel, are configured to provide at least a certain threshold amount of electrical power supply which at least meets the power support requirements of the rack computer systems.

At 1410, a configuration of inverter modules which collectively provides at least a certain amount of electrical power inversion functionality is determined. The configuration can include a determined quantity of predetermined inverter modules which, when electrically coupled in parallel, are configured to provide at least a certain threshold amount of inverted electrical power which at least meets the power support requirements of the rack computer systems. A configuration of inverter modules can be determined based at least in part upon a determination that the electrical power support to be provided to the rack computer systems is to be alternating current. Where the electrical power support is to be direct current, inverter module configurations may be omitted.

At 1412, the set of modular UPSs are installed according to the determined UPS configuration. Such installation can include generating an installation command which specifies the established UPS configuration and commands one or more entities to implement the installation. The installation command, which transmitted to the one or more entities, can cause the one or more entities to install the set of modular UPSs according to the command. In some embodiments, the installation command comprises a modular UPS assembly command which specifies a configuration of UPS modules and commands installation of the specified modules in one or more rack computer system frames, such that one or more modular UPSs are assembled according to the UPS configuration. The installation command can further include a command to install the one or more assembled modular UPSs.

Figure 15:
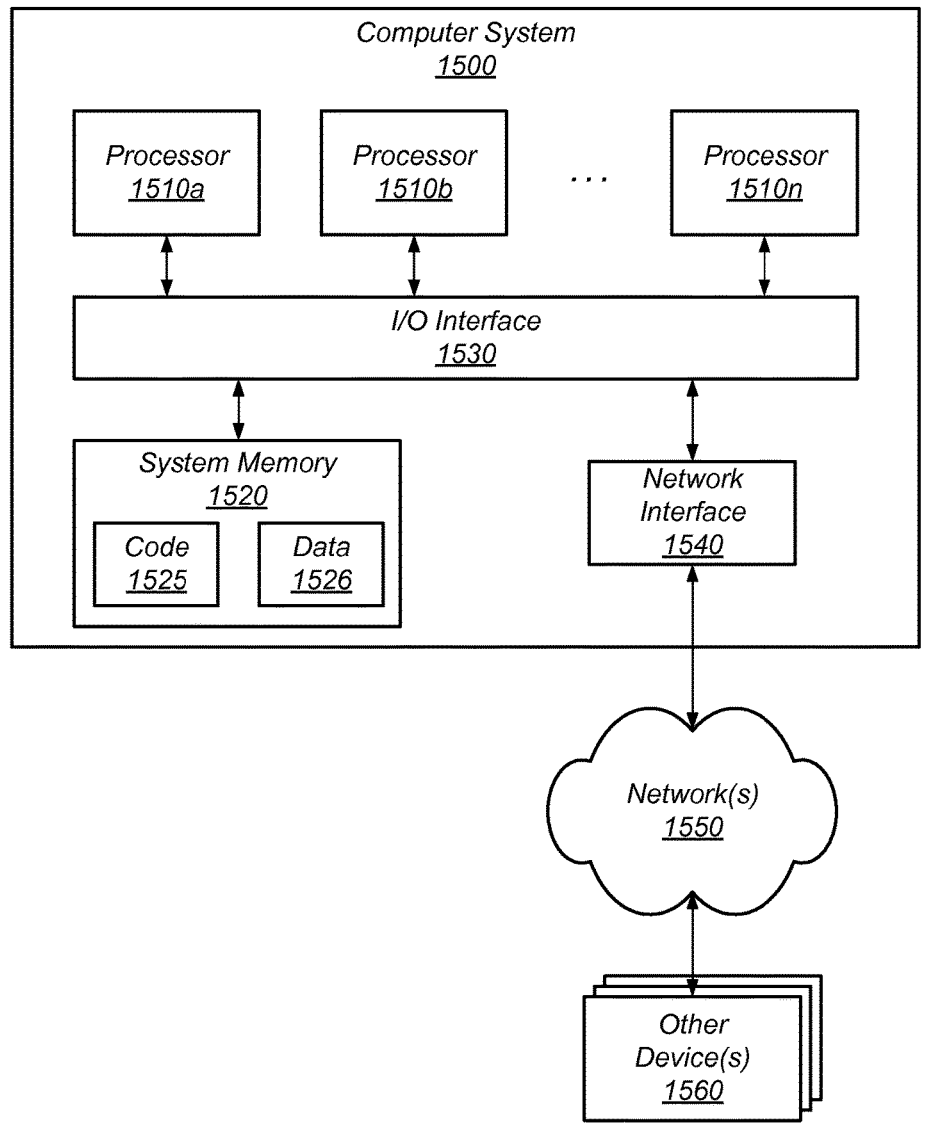
FIG. 15 is a block diagram illustrating an example computer system that may be used in some embodiments.

FIG. 15 is a block diagram illustrating an example computer system that may be used in some embodiments.

In some embodiments, a system that implements a portion or all of one or more of the technologies, including but not limited to a portion or all of providing scalable, modular uninterruptible power support, and various methods, systems, components, devices, and apparatuses as described herein, may include a general-purpose computer system that includes or is configured to access one or more computer-accessible media, such as computer system 1500 illustrated in FIG. 15. In the illustrated embodiment, computer system 1500 includes one or more processors 1510 coupled to a system memory 1520 via an input/output (I/O) interface 1530. Computer system 1500 further includes a network interface 1540 coupled to I/O interface 1530.

In various embodiments, computer system 1500 may be a uniprocessor system including one processor 1510, or a multiprocessor system including several processors 1510 (e.g., two, four, eight, or another suitable number). Processors 1510 may be any suitable processors capable of executing instructions. For example, in various embodiments, processors 1510 may be general-purpose or embedded processors implementing any of a variety of instruction set architectures (ISAs), such as the x86, PowerPC, SPARC, or MIPS ISAs, or any other suitable ISA. In multiprocessor systems, each of processors 1510 may commonly, but not necessarily, implement the same ISA.

System memory 1520 may be configured to store instructions and data accessible by processor(s) 1510. In various embodiments, system memory 1520 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of one or more of the technologies, including but not limited to a portion or all of providing scalable, modular uninterruptible power support, and various methods, systems, components, devices, and apparatuses as described herein, are shown stored within system memory 1520 as code 1525 and data 1526.

In one embodiment, I/O interface 1530 may be configured to coordinate I/O traffic between processor 1510, system memory 1520, and any peripheral devices in the device, including network interface 1540 or other peripheral interfaces. In some embodiments, I/O interface 1530 may perform any necessary protocol, timing or other data transformations to convert data signals from one component (e.g., system memory 1520) into a format suitable for use by another component (e.g., processor 1510). In some embodiments, I/O interface 1530 may include support for devices attached through various types of peripheral buses, such as a variant of the Peripheral Component Interconnect (PCI) bus standard or the Universal Serial Bus (USB) standard, for example. In some embodiments, the function of I/O interface 1530 may be split into two or more separate components, such as a north bridge and a south bridge, for example. Also, in some embodiments some or all of the functionality of I/O interface 1530, such as an interface to system memory 1520, may be incorporated directly into processor 1510.

Network interface 1540 may be configured to allow data to be exchanged between computer system 1500 and other devices 1560 attached to a network or networks 1550, such as other computer systems or devices as illustrated in FIGS. 1 through 14, for example. In various embodiments, network interface 1540 may support communication via any suitable wired or wireless general data networks, such as types of Ethernet network, for example. Additionally, network interface 1540 may support communication via telecommunications/telephony networks such as analog voice networks or digital fiber communications networks, via storage area networks such as Fibre Channel SANs, or via any other suitable type of network and/or protocol.

In some embodiments, system memory 1520 may be one embodiment of a computer-accessible medium configured to store program instructions and data for implementing embodiments of methods as described above relative to FIGS. 1-14. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1500 via I/O interface 1530. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1500 as system memory 1520 or another type of memory. Further, a computer-accessible medium may include transmission media or signals such as electrical, electromagnetic, or digital signals, conveyed via a communication medium such as a network and/or a wireless link, such as may be implemented via network interface 1540.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a computer room comprising a plurality of sets of rack computer systems configured to perform computing operations; and
   a power distribution system configured to provide electrical power support to the rack computer systems in the data center, wherein the power distribution system comprises:
      a power feed configured to selectively supply electrical power from a selected one of a utility power source or a generator power source, and
      a plurality of modular uninterruptible power supplies (UPSs), installed in the computer room, configured to receive electrical power from the power feed and each modular UPS configured to provide uninterruptible power support to a separate corresponding set of rack computer systems in the computer room, wherein each modular UPS comprises:
         at least one rack computer system frame configured to structurally support a corresponding plurality of UPS modules; and
         the corresponding plurality of modules including:
            at least one rectifier module mounted in a particular rack position of the at least one rack computer system frame and electrically coupled to the power feed, and
            at least one battery module mounted in a different rack position of the at least one rack computer system frame, electrically coupled to the at least one rectifier module, and electrically coupled to the corresponding set of rack computer systems.

2. The data center of claim 1, wherein:
   each separate modular UPS comprises a plurality of rectifier modules and a plurality of battery modules electrically coupled in parallel with the corresponding set of rack computer systems, such that the modular UPS is configured to provide uninterruptible power support to the corresponding set of rack computer systems subsequent to a failure of at least one of the rectifier modules or at least one of the battery modules.

3. The data center of claim 2, wherein:
   each separate modular UPS comprises a plurality of rack computer system frames electrically coupled via a common power bus bar, each rack computer system frame comprising at least one rectifier module of the plurality of rectifier modules and at least one battery module of the plurality of battery modules.

4. The data center of claim 1, wherein at least one of the modular UPSs further comprises:
   at least one inverter module mounted in the at least one rack computer system frame, electrically coupled to the at least one battery module, and electrically coupled to the corresponding set of rack computer systems, such that the at least one battery module is electrically coupled to the corresponding set of rack computer systems via the at least one inverter module;
   a power busway, which electrically couples the at least one inverter module and the corresponding set of rack computer systems and is configured to carry alternating-current electrical power from the at least one inverter module to the corresponding set of rack computer systems; and a power bus bar, configured to carry direct-current electrical power, which electrically couples the at least one inverter module, the at least one rectifier module, and the at least one battery module.

5. An apparatus, comprising:
a modular uninterruptible power supply (UPS) configured to be mounted in at least one rack computer system frame and further configured to provide uninterruptible power support to at least a plurality of rack computer systems, wherein the modular UPS comprises:
at least one rectifier module installed in a particular rack position within at least one rack computer system frame and electrically coupled to a power source,
and
at least one battery module installed in a different rack position within at least one rack computer system frame, electrically coupled to the rectifier module, and configured to supply electrical power to the plurality of rack computer systems.

6. The apparatus of claim 5, wherein the modular UPS further comprises:
at least one inverter module electrically coupled to both the at least one battery module and the plurality of rack computer systems, such that the at least one inverter module is configured to supply alternating-current electrical power to the plurality of rack computer systems.

7. The apparatus of claim 5, wherein the modular UPS comprises:
a common power bus bar configured to electrically couple the at least one rectifier module to the at least one battery module.

8. The apparatus of claim 7, wherein:
the modular UPS comprises a common rack computer system frame configured to structurally support the at least one rectifier module, the at least one battery module, and the common power bus bar;
the common power bus bar is mounted on the common rack computer system frame; and
the at least one rectifier module and the at least one battery module are mounted in the common rack computer system frame and electrically coupled to the common power bus bar.

9. The apparatus of claim 8, wherein:
at least the common power bus bar and the at least one battery module comprise corresponding blind mate connectors, such that the at least one battery module is configured to be electrically coupled to the common power bus bar via coupling of the corresponding blind mate connectors.

10. The apparatus of claim 5, wherein:
the modular UPS comprises a set of rack computer system frames which are each configured to structurally support the at least one rectifier module or the at least one battery module; and
the at least one rectifier module and the at least one battery module are mounted in separate rack computer system frames, of the set of rack computer system frames, and are electrically coupled via at least one instance of power transmission lines extending externally between the separate rack computer system frames.

11. The apparatus of claim 10, wherein:
the at least one instance of power transmission lines extending externally between the separate rack computer system frames comprises a common power bus bar configured to carry direct-current electrical power;
the at least one rectifier module and the at least one battery module are each configured to couple separately with the common power bus bar, such that the at least one rectifier module and the at least one battery module are electrically coupled via the common power bus bar; and
to supply electrical power to the plurality of rack computer systems, the at least one battery module is configured to be electrically coupled to the plurality of rack computer systems via one or more other power transmission lines which are separate from the common power bus bar.

12. The apparatus of claim 5, wherein the modular UPS comprises at least one of:
a plurality of rectifier modules electrically coupled in parallel to the power source and electrically coupled in parallel to the at least one battery module, such that the plurality of rectifier modules is configured to supply electrical power to the at least one battery module subsequent to a failure of at least one rectifier module in the plurality of rectifier modules; or
a plurality of battery modules electrically coupled in parallel to the at least one rectifier module and electrically coupled in parallel to the plurality of rack computer systems, such that the plurality of battery modules is configured to supply electrical power to the plurality of rack computer systems subsequent to a failure of at least one battery module in the plurality of battery modules.

13. The apparatus of claim 5, wherein:
the at least one rectifier module comprises:
a shelf chassis configured to be mounted in a rack computer system frame;
a backplane configured to be coupled with the shelf chassis, comprising a plurality of sub-module connectors and a bus bar connector configured to electrically couple the sub-module connectors with at least one other UPS module; and
a plurality of sub-modules, mounted in the shelf chassis and connected with separate sub-module connectors of the backplane, wherein each sub-module is configured to provide a limited portion of the functionality provided by the at least one rectifier module.

14. A method, comprising:
configuring a modular uninterruptible power supply (UPS) to provide uninterruptible power support to a plurality of rack computer systems, wherein the configuring comprises:
installing a rectifier module in a particular rack position within at least one rack computer system frame, such that the rectifier module is configured to receive electrical power from at least one power source; and
installing a battery module in a different rack position within at least one rack computer system frame, such that the battery module is electrically coupled with the rectifier module and is configured to supply electrical power to the plurality of rack computer systems.

15. The method of claim 14, wherein the configuring comprises:
installing an inverter module in at least one rack computer system frame, such that the inverter module is electrically coupled with at least the battery module and is electrically coupled with the plurality of rack computer systems, such that the battery module is configured to supply electrical power to the plurality of rack computer systems via the inverter module.

16. The method of claim 15, wherein installing the inverter module in at least one rack computer system frame comprises:
installing a plurality of inverter modules in at least one rack computer system frame, wherein the plurality of inverter modules are electrically coupled with the plurality of rack computer systems in parallel and are configured to supply alternating current electrical power to the plurality of rack computer systems.

17. The method of claim 14, wherein:
electrically coupling the rectifier module with the battery module comprises coupling the rectifier module and the battery module with a common power bus bar configured to carry electrical power.

18. The method of claim 17, wherein:
the configuring comprises installing the rectifier module, the battery module, and the common power bus bar in a common rack computer system frame; and
coupling the rectifier module and the battery module with the common power bus bar comprises mounting each of the rectifier module and the battery module in the common rack computer system frame such that separate connectors of the rectifier module and the battery module are coupled with separate connectors of the common power bus bar.

19. The method of claim 14, wherein:
the configuring comprises providing a set of rack computer system frames which are each configured to structurally support at least one of the rectifier module or the battery module;
installing the rectifier module in at least one rack computer system frame comprises installing the rectifier module in a particular rack computer system frame, of the set of rack computer system frames; and
installing the battery module in at least one rack computer system frame comprises installing the battery module in a separate rack computer system frame, of the set of rack computer system frames.

20. The method of claim 14, wherein the configuring comprises:
configuring a plurality of modular UPSs to provide parallel uninterruptible power support to the plurality of rack computer systems, wherein such configuring comprises:
electrically coupling the plurality of modular UPSs in parallel to the plurality of rack computer systems via a common power bus bar.

* * * * *